US009575683B2

(12) United States Patent
Achtenberg et al.

(10) Patent No.: US 9,575,683 B2
(45) Date of Patent: Feb. 21, 2017

(54) PROCESSING SHAPED DATA

(71) Applicant: SANDISK TECHNOLOGIES INC., Plano, TX (US)

(72) Inventors: Stella Achtenberg, Netanya (IL); Eran Sharon, Rishon Lezion (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/803,777

(22) Filed: Jul. 20, 2015

(65) Prior Publication Data
US 2015/0324148 A1 Nov. 12, 2015

Related U.S. Application Data

(63) Continuation-in-part of application No. 13/690,275, filed on Nov. 30, 2012, now Pat. No. 9,135,155.

(51) Int. Cl.
*G06F 11/10* (2006.01)
*G06F 3/06* (2006.01)
*G11C 11/56* (2006.01)
*G11C 16/34* (2006.01)

(52) U.S. Cl.
CPC .......... *G06F 3/0644* (2013.01); *G06F 3/0614* (2013.01); *G06F 3/0679* (2013.01); *G06F 11/1012* (2013.01); *G11C 11/5621* (2013.01); *G11C 16/349* (2013.01); *G11C 16/3459* (2013.01)

(58) Field of Classification Search
CPC .................................................. G01R 31/3187
USPC ........................................ 714/773, 770, 763
See application file for complete search history.

(56) References Cited

U.S. PATENT DOCUMENTS

| | | | |
|---|---|---|---|
| 5,815,537 A | * | 9/1998 | Janssen ............... H04L 27/2017 333/20 |
| 6,218,968 B1 | | 4/2001 | Smeets et al. |
| 6,826,649 B2 | | 11/2004 | Norman |
| 7,466,575 B2 | | 12/2008 | Shalvi et al. |
| 8,068,380 B2 | | 11/2011 | Nasu et al. |
| 8,239,734 B1 | | 8/2012 | Shalvi |
| 8,694,854 B1 | | 4/2014 | Dar et al. |
| 8,799,559 B2 | | 8/2014 | Sharon et al. |
| 2008/0024437 A1 | | 1/2008 | Morooka |
| 2011/0246859 A1 | | 10/2011 | Haratsch et al. |

(Continued)

FOREIGN PATENT DOCUMENTS

| | | |
|---|---|---|
| WO | 2010039859 A1 | 4/2010 |
| WO | 2010092536 A1 | 8/2010 |
| WO | 2012154255 A1 | 11/2012 |

OTHER PUBLICATIONS

International Preliminary Report on Patentability of the International Searching Authority (EPO) for International Application No. PCT/US2013/071061, mailed Jun. 11, 2015, 8 pages.

(Continued)

*Primary Examiner* — Fritz Alphonse
(74) *Attorney, Agent, or Firm* — Toler Law Group, PC

(57) ABSTRACT

Systems and methods of processing shaped data to include selectively performing a modification operation. The modification operation may be performed in response to determining that shaped data satisfies one or more shaping adjustment criteria. Shaping of data may be discontinued to at least a portion of a memory based on a health metric for the portion satisfying a threshold.

30 Claims, 5 Drawing Sheets

(56) References Cited

U.S. PATENT DOCUMENTS

2014/0135748 A1* 5/2014 Dai .................... A61F 9/00804
606/5

OTHER PUBLICATIONS

Non-Final Office Action mailed Dec. 18, 2014 in U.S. Appl. No. 13/690,275, 5 pages.
International Search Report and Written Opinion of the International Searching Authority (EPO) for International Application No. PCT/US2013/071061, mailed May 30, 2014, 13 pages.
Notice of Allowance and Fee(s) Due mailed May 22, 2015 in U.S. Appl. No. 13/690,275, 5 pages.
Non-Final Office Action mailed Jul. 18, 2014 in U.S. Appl. No. 13/690,275, 6 pages.
Xie, et al., "Using Lossless Data Compression in Data Storage Systems: Not for Saving Space", IEEE Transactions on Computers, vol. 60, No. 3, Mar. 2011, 11 pages.

* cited by examiner

PROCESSING SHAPED DATA

REFERENCE TO EARLIER-FILED APPLICATIONS

This application claims priority from U.S. Non-Provisional patent application Ser. No. 13/690,275, filed Nov. 30, 2012, the contents of which is incorporated by reference herein in its entirety.

FIELD OF THE DISCLOSURE

The present disclosure is generally related to processing shaped data.

BACKGROUND

As the number of write/erase (W/E) (a.k.a. program/erase (P/E)) cycles performed in a flash memory increases, data retention capability of the flash memory is reduced and the probability of failures is increased. Such failures are usually related to wearing of an oxide isolation layer of cells in the flash memory due to electrons passing through the oxide isolation layer during W/E cycles and generating electron trap sites. Such failures can be manifested in several ways, such as by failing to erase or program a block of cells in the flash memory or by having reduced cell data retention (i.e., a reduced ability to store data reliably for a certain period of time). As cell dimensions shrink, a corresponding reduction in endurance may become a limiting factor affecting commercial viability of non-volatile memories, such as NAND-based flash memory.

Data with a distribution that is different (e.g., significantly different) than a distribution induced by an independent and identically distributed (i.i.d.) bit source having equal probability for 1 and 0 may be said to be "shaped." Examples of shaped data include data that contains a higher number of 1-s than 0-s, or vice versa (e.g., data which contains a higher number of 0-s than 1-s). An amount of shaping may correspond to entropy of a data source that is determined relative to an alphabet of data and its distribution. For example, binary entropy is the entropy of an i.i.d. data source having an alphabet $\{0, 1\}$. Binary entropy can be determined as $H(p) = -p(0)\log_2 p(0) - p(1)\log_2 p(1)$, where $p(0)$ is the probability that the data source will generate the value 0 and $p(1)$ is the probability that the data source will generate the value 1. If the data source has a distribution of 90% 0-s and 10% 1-s, the entropy $H(p)$ is approximately equal to 0.47. As another example, if an i.i.d. data source has an alphabet that contains four symbols $\{A, B, C, D\}$, the entropy of the data source can be determined as $H(p) = -p(A)\log_2 p(A) - p(B)\log_2 p(B) - p(C)\log_2 p(C) - p(D)\log_2 p(D)$. If A, B, C, and D are represented in the data by the ordered pairs (0,0), (0,1), (1,0), and (1,1), respectively, low entropy but equal probability of states A and D may result, such as when $p(0,0) = p(1,1) = 0.05$ and $p(1,0) = p(0,1) = 0.45$.

Any data that includes a logical page of data having entropy lower (e.g., significantly lower) than one (where one is the binary entropy of data having 50% zeros and 50% ones) can be considered to be shaped. Criteria for considering a value of entropy to be significantly lower than '1' may vary according to each particular implementation. In some examples, shaped data may have a higher number of 1-s because in conventional NAND flash systems, '1' typically represents an erase ("ER") state while '0' typically represents a programmed state. Shaping data to have a higher number of 1-s may increase a useful life of a flash memory because increasing the proportion of memory cells that are set to the erase state (i.e., cells set to logical '1") causes less wear of the flash cells and increases the number of W/E cycles that the NAND flash cells may undergo while maintaining a pre-defined storage reliability.

In many cases, wearing of the cells of a non-volatile memory (NVM) may be the factor that limits the useful life of a flash memory system. Various methods may be used to shape compressible data to form shaped data, such that the portion of 1-s in the shaped data is larger than the portion of 0-s. Because '1' typically corresponds to the Erase state in a NVM, the NVM partition may experience less wear when programmed with shaped data. Thus, shaping the data stored in the NVM may reduce wear, thereby increasing an endurance of the NVM. Additionally, shaping the data may reduce an average bit error rate (BER). However, shaping data may increase a variance (e.g., a maximum or instantaneous value) of the BER due to potentially problematic combinations of shaped data.

SUMMARY

Techniques are disclosed for modifying data based on whether a combination of logical pages of the shaped data satisfies one or more shaping adjustment criteria. The shaping adjustment criteria may be indicative of a combination of logical pages of shaped data that is likely to result in an unacceptably high bit error rate (BER). For example, the shaping adjustment criteria may be indicative of a combination of logical pages that is associated with a sufficiently high likelihood of program disturb or that is associated with a problematic overlap of neighboring cell states. Performing the modification operation may modify the shaped data such that the shaped data does not experience an unacceptably high bit error rate. The data may be shaped without modification while the shaping adjustment criteria is not satisfied, thereby providing enhanced endurance and average BER associated with shaping data, and the data may be modified when the shaping adjustment criteria is satisfied, thereby addressing high individual or instantaneous BER associated with potentially problematic combinations of shaped data.

Techniques are disclosed for discontinuing shaping of data to be stored to at least a portion of a memory when a health metric associated with the at least the portion satisfies a threshold. The threshold may be selected to reduce or avoid reliability issues associated with worn cells of the memory. For example, storing a particular combination of logical pages of shaped data may result in a higher BER when the memory is worn than when the memory is fresh. The BER induced by the particular combination when the memory is fresh may correspond to a BER that a data storage device can correct or otherwise compensate for. Thus, the particular combination may not introduce reliability issues when the memory is fresh. Conversely, the higher BER caused by the particular combination when the memory is worn may correspond to a BER that a data storage device is unable to correct or otherwise compensate for. Thus, the particular combination may introduce reliability issues when the memory is worn. In order to experience benefits of shaping data, such as increased endurance and reduced average BER, the data storage device may be configured to shape data while the memory is fresh enough to not result in more errors than the data storage device can correct or otherwise compensate for. Additionally, the data storage device may be configured to curb reliability issues associated with shaping data by discontinuing shaping of data when the memory is worn enough to experience an instantaneous BER due to data shaping that the data storage device is not capable of correcting or otherwise compensating for.

DETAILED DESCRIPTION

Figure 1:
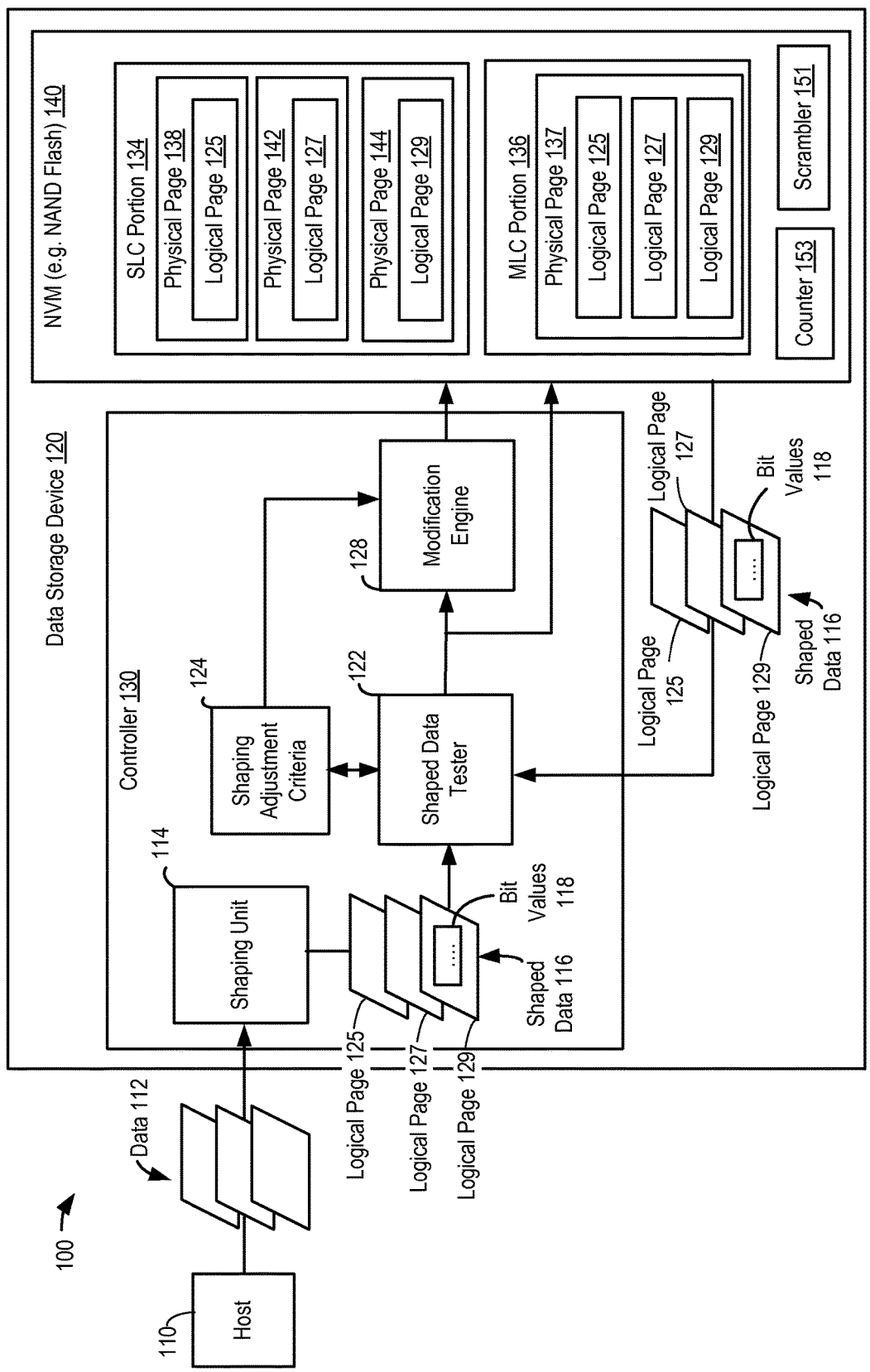
FIG. 1 is a block diagram illustrating a particular embodiment of a system to perform a modification operation based on whether one or more shaping adjustment criteria are satisfied.

FIG. 1 depicts a system 100 that includes a data storage device 120 coupled to a host device 110. The data storage device 120 is configured to determine whether shaped data satisfies a shaping adjustment criterion (shaping adjustment criteria). The data storage device 120 includes a non-volatile memory (NVM) 140 and a controller 130 coupled to the NVM 140. The NVM 140 may correspond to or include any type of non-volatile memory, such as a flash memory (e.g., NAND flash memory). During operation, the host device 110 may provide data 112 to the data storage device 120. The data 112 may include multiple logical pages of data.

The controller 130 may be configured to receive the data 112 from the host device 110 and to send data and commands to the NVM 140. The controller 130 includes a shaping unit 114. The shaping unit 114 is configured to shape the data 112 to produce shaped data 116, which includes at least one logical page of data having an entropy lower (e.g., significantly lower) than one (where one is the binary entropy of data having 50% zeros and 50% ones). In some examples, each logical page of the logical pages 125, 127, and 129 of the shaped data 116 is shaped (e.g., has entropy lower or significantly lower than one). In other examples, less than all of (e.g. one or two of) the logical pages 125, 127, and 129 of the shaped data 116 have a substantially uniform distribution (e.g., an entropy of about 1). In some examples, shaped data may have a higher number of 1-s because in conventional NAND flash systems, '1' typically represents an erase state while '0' typically represents a programmed state. Any shaping technique may be used to generate the shaped data 116 from the data 112. For example, the controller 130 may use a reversible process to shape the data 112 into the shaped data 116 by deciding whether to flip each particular bit of a data word based on a history of bit values of the data word that have been processed prior to processing the particular bit.

The NVM 140 may include a single level cell (SLC) portion 134 and a multi-level cell (MLC) portion 136. The SLC portion 134 may act as a cache (e.g., a write cache) for blocks of the MLC portion 136. The MLC portion 136 may include multiple word lines of storage elements, such as a word line of a multi-level cell (MLC) flash memory. The word line may include a physical page 137 that includes flash MLC cells. Logical pages of data may be copied from physical pages 138, 142, and 144 of the SLC portion 134 to a single physical page 137 of the MLC portion 136 by reading the data from the physical pages 138, 142, and 144 of the SLC portion 134 and writing the same data to the physical page 137 of the MLC portion 136 in an operation referred to as folding. The folding operation may be performed using on-chip circuitry. For example, the logical pages 125, 127, and 129 may be cached into the physical pages 138, 142, and 144 of the SLC portion 134 and subsequently folded into the physical page 137 of the MLC portion 136 using circuitry on the NVM 140. Although FIG. 1 illustrates the MLC portion 136 as including three logical pages per cell (e.g., a 3-bit per cell MLC), the MLC portion 136 may be configured to store more than three (e.g., 4) or less than three (e.g., 2) bits per cell.

The controller 130 may include a shaped data tester 122. Alternatively or additionally, the NVM 140 may include on-chip circuitry, such as counter 153 or shaped data tester 123, that is configured to perform one or more shaped data testing operations as described below. The shaped data tester 122 or 123 may be configured to determine a shaping level of the logical pages 125, 127, and 129 of the shaped data 116, and/or may be configured to determine whether a combination of the logical pages 125, 127, and 129 of the shaped data 116 satisfies one or more criteria of shaping adjustment criteria 124 based on a shaping level of the logical pages 125, 127, and 129 of the shaped data 116, as described below. In some implementations, the shaped data tester 122 or 123 may be configured to measure a shaping level of the shaped data 116, such as by counting '1' values in the shaped data 116. The shaped data tester 122 or 123 may be configured to determine an indication of an observed shaping level ($p_e$) for each of the logical pages 125, 127, and 129 of the shaped data. The indication of the observed shaping level $p_e$ may represent a ratio of a count of 1 values of data as compared to total count of values of the data. For example, the shaped data tester 122 or 123 may determine an indication of an observed shaping level $p_{e1}$ for the logical page 125 corresponding to a ratio of the number of 1-s in the data of the logical page 125 as compared to a total count of values (the number of 1-s added to the number of 0-s) of the data of the logical page 125. The shaped data tester 122 or 123 may determine an indication of an observed shaping level $p_{e2}$ for the logical page 127 corresponding to a ratio of the number of 1-s in the data of the logical page 127 as compared to a total count of values (the number of 1-s added to the number of 0-s) of the data of the logical page 127. The shaped data tester 122 or 123 may determine an indication of an observed shaping level $p_{e3}$ for the logical page 129 corresponding to a ratio of the number of 1-s in the data of the logical page 129 as compared to a total count of values (the number of 1-s added to the number of 0-s) of the data of the logical page 129.

In some examples, the data storage device 120 may be configured to determine shaping levels of the logical pages 125, 127, and 129 of the shaped data 116 before transferring the shaped data 116 to the NVM 140. In these examples, the shaped data tester 122 may determine the shaping levels of the logical pages 125, 127, and 129 and the controller 130 may store the indications of the observed shaping levels $p_{e1}$, $p_{e2}$, and $p_{e3}$ for the logical pages 125, 127, and 129 in a management table (e.g., a logical to physical mapping table) managed by the controller 130.

Alternatively or additionally, the data storage device 120 may be configured to determine the shaping levels of the shaped data 116 after storing the shaped data 116 in the NVM 140. As an example, the data storage device 120 may be configured to store the shaped data 116 in the SLC portion 134 without modifying the shaped data 116 (e.g., without performing a modification operation on the shaped data 116). Prior to folding the logical pages 125, 127, and 129 of the shaped data 116 into the physical page 137, the logical pages 125, 127, and 129 may be transferred to the controller 130 (e.g., to the shaped data tester 122). The shaped data tester 122 on the controller 130 may subsequently determine shaping levels of the logical pages 125, 127, and 129 of the shaped data 116 as described above. As another example, prior to folding the logical pages 125, 127, and 129 of the shaped data 116 into the physical page 137, the counter 153 on the NVM 140 may be configured to determine shaping levels of the logical pages 125, 127, and 129 of the shaped data 116 by counting 1's as described above. Thus, the data storage device 120 may configured to determine a shaping level of each of the logical pages 125, 127, and 129 of the shaped data 116 before transferring the shaped data 116 to the NVM 140, after transferring the shaped data 116 to the NVM 140, or both, and the shaping levels may be determined by the controller 130, by on-chip circuitry of the NVM 140, or both.

After shaping levels are determined for the logical pages 125, 127, and 129 of the shaped data 116, the shaped data tester 122 or 123 may be configured to use the determined shaping levels to determine a characteristic, property, or distribution pattern of the shaped data 116 (e.g., of a combination of the logical pages 125, 127, and 129 of the shaped data 116). For example, the shaped data tester 122 or 123 may be configured to use the determined shaping levels of the logical pages 127, 127, and 129 of the shaped data 116 to determine a distribution pattern indicative of a probability of one or more cell states, as described in more detail below with reference to FIG. 3.

The shaped data tester 122 or 123 may be configured to determine whether the shaped data 116 (e.g., the combination of the logical pages 125, 127, and 129 to be folded into the physical page 137) satisfies one or more criteria associated with one or more modification operations (e.g., one or more criteria of the shaping adjustment criteria 124). For example, the shaped data tester 122 or 123 may be configured to determine whether the combination of the logical pages 125, 127, and 129 satisfies one or more criteria of the shaping adjustment criteria 124 by comparing the shaping adjustment criteria 124 to the determined shaping levels of the logical pages 125, 127, and 129 and/or to the determined characteristic, property, or distribution pattern. The shaping adjustment criteria 124 may correspond to, include, or be based on (e.g., derived from) threshold voltage distribution patterns (including particular probabilities of one or more cell states of distribution patterns) resulting from combinations of logical pages of shaped data that are regarded as problematic (e.g., may induce unacceptable bit error rate (BER)).

The one or more modification operations may include an interchange operation, a scrambling operation, a page matching operation, an adaptive trim operation, a read verify operation, or an operation to adjust one or more system thresholds. The modification operations are described in more detail with reference to FIG. 4. Based on whether the shaped data 116 is determined to satisfy one or more criteria of the shaping adjustment criteria 124, the shaped data 116 may be modified and subsequently folded into the physical page 137 or may be folded into the physical page 137 without performing a modification operation. For example, when the shaped data tester 122 or 123 determines that the shaped data 116 satisfies one or more of the shaping adjustment criteria 124, the modification engine 128 (or the scrambler 151) may modify the shaped data 116 as described in more detail below with reference to FIG. 4. Thus, the data storage device 120 may perform a modification operation based on whether shaping levels or a characteristic, property, or distribution pattern of a combination of logical pages of shaped data to be written to a physical page of an MLC portion of an NVM is indicative of a problematic combination of shaped data, thereby reducing potential errors and resulting reliability issues that may be caused by shaping data.

Figure 2:
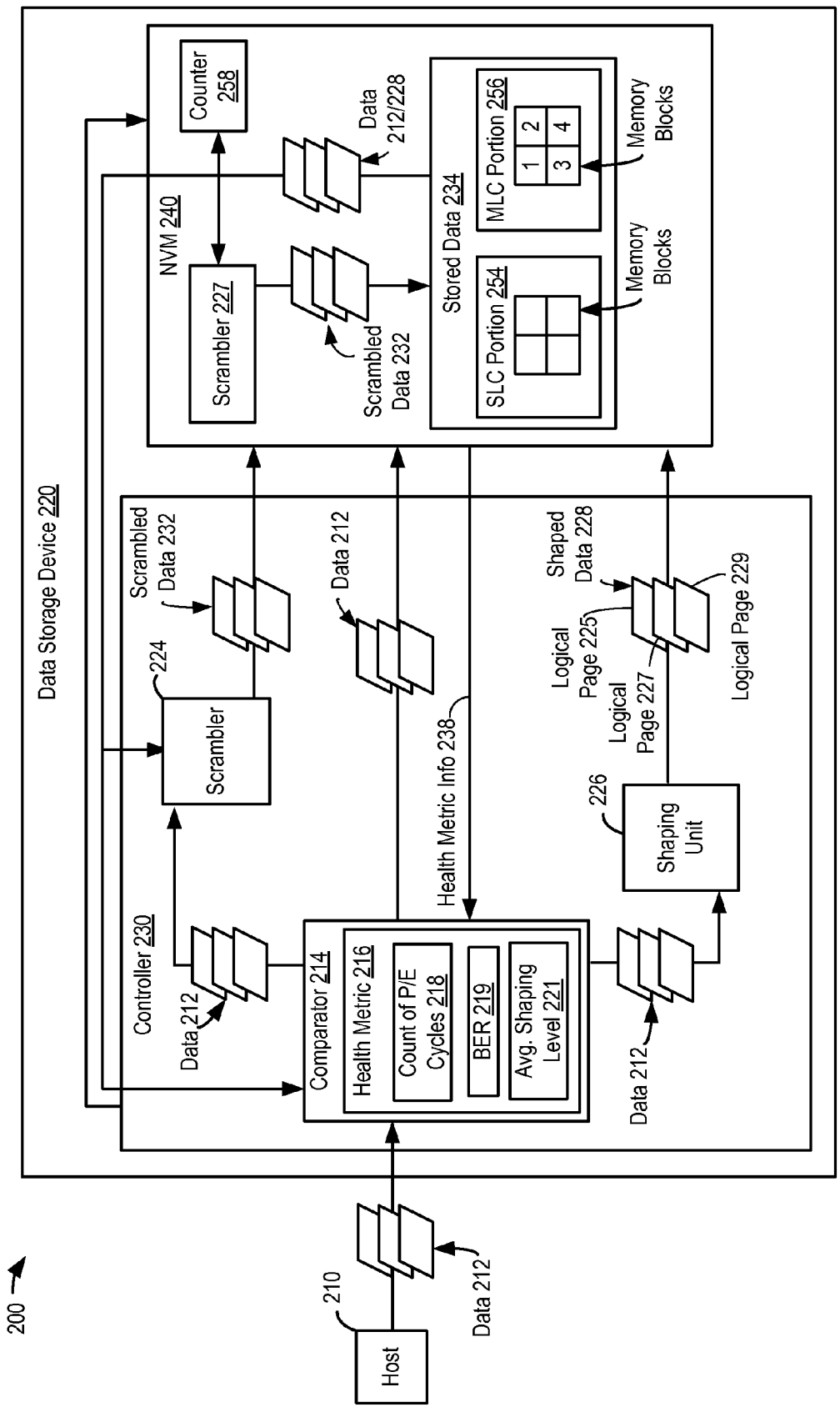
FIG. 2 is a block diagram illustrating a particular embodiment of a system to discontinue shaping data to be stored to a portion of a non-volatile memory based on whether a health metric for the portion satisfies a threshold.

FIG. 2 illustrates a system 200 that includes a data storage device 220. The data storage device 220 is configured to bypass a shaping unit (e.g., to discontinue shaping data) based on a health metric for at least a portion of a NVM 240 of the data storage device 220.

The data storage device 220 includes the NVM 240 and a controller 230 coupled to the NVM 240. The NVM 240 may correspond to or include any type of non-volatile memory, such as a flash memory (e.g., NAND flash memory).

The controller 230 may be configured to receive data 212 (e.g., multiple logical pages of data) from host device 210 and to send data and commands to the NVM 240. The controller 230 may include a comparator 214, a shaping unit 226, and a scrambler 224. The controller 230 may be configured to determine a health metric 216 for each region of one or more regions of the NVM 240. The shaping unit 114 may be configured to perform a shaping operation on data (e.g., the data 212) to generate shaped data, such as shaped data 228, to be stored at a portion of the NVM 240 (e.g., at a region of the one or more regions) until the controller 230 determines that the health metric 216 that corresponds to the portion of the NVM 240 satisfies (e.g., matches/equals or exceeds) a threshold. The shaped data 228 may be any data that includes at least one logical page of data (e.g., at least one logical page of logical pages 225, 227, or 229) having entropy less than (e.g., significantly less than) 1. The controller 230 may bypass the shaping unit 226 in response to the comparator 214 indicating that the health metric 216 satisfies the threshold. For example, the controller 230 may discontinue shaping of data to be stored at the portion of the NVM 240 while not discontinuing shaping data to be stored to one or more other portions of the NVM 240 that are healthier (e.g., associated with health metrics that do not satisfy the threshold).

The threshold may be selected to reduce reliability issues that may be associated with worn cells of the NVM 240. For example, storing shaped data (e.g., the shaped data 228) to the NVM 240 may result in a higher BER when the NVM 240 is worn than when the NVM 240 is fresh. The BER induced by the storing the shaped data when the NVM 240 is fresh may correspond to a BER that the data storage device 220 can correct (e.g., using an ECC) or otherwise compensate for. Thus, storing the shaped data 228 (and therefore performance of the shaping operation to shape the data) may not introduce reliability issues when the NVM 240 is fresh. Conversely, the higher BER caused by storing the shaped data 228 when the NVM 240 is worn may correspond to a BER that the data storage device 220 is unable to correct or otherwise compensate for. Thus, storing the shaped data 228 (and therefore performance of the shaping operation) may introduce reliability issues when the NVM 240 is worn. In light of the above, the threshold may be selected based on a point at which the health metric 216 is indicative of a transition from a wear level at which shaped data (e.g., the shaped data 228) will not result in more errors than the data storage device 220 can correct or otherwise compensate for to a wear level at which the shaped data will (or is sufficiently likely to) result in more errors than the data storage device 220 can correct or otherwise compensate for.

In some implementations, the health metric 216 may be a single metric that corresponds to the entire NVM 240. Alternatively, the NVM 240 may include multiple regions and the controller 230 may maintain a health metric for each of the regions. For example, each region of the multiple regions of the NVM 240 may correspond to one or more planes of the NVM 240. To illustrate, the NVM 240 may include multiple planes and a first region may correspond to a first plane and a second region may correspond to a second plane. Alternatively or additionally, the multiple planes may include first, second, third, and fourth planes, and the first region may correspond to the first and second planes and the second region may correspond to the third and fourth planes. Alternatively or additionally, each region of the multiple regions may correspond to an individual block (e.g., a flash erase block) of the NVM 240. To illustrate, the first region may correspond to a first block ("1") and the second region may correspond to a second block ("2"). Alternatively or additionally, each region of the multiple regions of the NVM 240 may correspond to a group of blocks of the NVM 240. To illustrate, the first region may correspond to a first group of blocks including the first block 1 and the second block 2, and the second region may correspond to a second group of blocks including a third block ("3") and a fourth block ("4"). Alternatively or additionally, each region of the multiple regions may correspond to one or more dies of the NVM 240. To illustrate, the NVM 240 may include multiple dies and the first region may correspond to a first die and the second region may correspond to a second die. Alternatively or additionally, the multiple dies may include first, second, third, and fourth dies, and the first region may correspond to the first and second dies and the second region may correspond to the third and fourth dies. Alternatively or additionally, each region of the multiple regions of the NVM 240 may correspond to a group of word-lines of the NVM 240. To illustrate, the first region may correspond to a first group of word-lines of the NVM 240, and the second region may correspond to a second group of word-lines of the NVM 240. Thus, the health metric 216 may be determined on a block by block basis, a block group by block group basis, a die by die basis, a plane by plane basis, a word-line group by word-line group basis, one or more other bases, or a combination thereof.

In some examples, the health metric 216 may correspond to a number or count of program/erase (P/E) cycles 218 performed to a particular region of the NVM 240. The count of P/E cycles 218 may be determined using a technique that may be performed in a wear leveling process. In some examples, the comparator 214 may include one or more counters. Each of the one or more counters may be configured to store a value corresponding to or indicative of a count a number of P/E cycles 218 performed to a corresponding region of the one or more regions of the NVM 240. To illustrate, the one or more regions of the NVM 240 may include a first region and a second region, and the one or more counters may include a first counter and a second counter. In this example, the first counter may be configured to track the count of P/E cycles 218 performed on the first region and the second counter may be configured to track a second count of P/E cycles performed on the second region.

As another example, the health metric 216 may correspond to an average BER 219. In these examples, the health metric 216 may correspond to the average BER 219 of data stored at a particular region of the one or more regions. The comparator 214 may be configured to determine (e.g., may compute, calculate, or receive) the average BER 219 based on a single P/E cycle or over multiple P/E cycles. The comparator 214 may determine the average BER 219 using any known technique. In some examples, the comparator 214 may include or be coupled to an ECC engine [not illustrated]. The ECC engine may be configured to receive shaped data read from the NVM 240, check the read shaped data for errors, and determine a number of errors in the read shaped data.

For example, data 212/228 may be shaped data and may be read from a first region of the NVM 240 and provided to the ECC engine. The ECC engine may check the data 212/228 to determine a number of errors in the data 212/228. The ECC engine may identify errors in the data 212/228, provide information indicative of the identified errors to the comparator 214, and the comparator 214 may calculate or compute an average BER 219 for the first region (e.g., for the at least the portion of the NVM 240) based on the information indicative of the identified errors received from the ECC engine.

The health metric 216 may correspond to an average shaping level 221. The average shaping level 221 for at least a portion of the NVM 240 (e.g., for a region of the one or more regions) may correspond to an average of measured shaping levels of stored data in the at least the portion at a particular time or to an average of measured shaping levels of data stored in the at least the portion during a particular period (during multiple P/E cycles performed to the region). For example, the average shaping level 221 of a first region of the one or more regions may correspond to an average of measured shaping levels of shaped data stored at the first region over the life of the NVM 240 (e.g., up to the point of latest measurement).

The comparator 214 may measure the shaping levels using any known technique. In some examples, the controller 230 may include a shaping level engine [not illustrated] to determine the shaping levels. Additionally or alternatively, the NVM 240 may include a counter 258 to determine the shaping levels.

In some implementations, the shaping level engine on the controller 230 or the counter 258 may be configured to measure the shaping levels by counting '1' values. The shaping level engine on the controller 230 or the counter 258 may determine an indication of an observed shaping level $p_e$ (as described above) for each of the one or more regions. To illustrate, the shaped data 228 may correspond to shaped data stored in a first region of the one or more regions. The shaping level engine on the controller 230 or the counter 258 may be configured to measure shaping levels for the first region by counting '1' values in the shaped data 228. The shaping level engine on the controller 230 or the counter 258 may be configured to determine the indication of the observed shaping level $p_e$ for the first region by determining a ratio of the count of 1 values in the shaped data 228 as compared to a total count of values of the shaped data 228. The indication of the observed shaping level $p_e$ may correspond to the average shaping level 221 for the data stored in the first region. Alternatively, the indication of the observed shaping level $p_e$ may be determined at various times, and the average of the indication of the observed shaping level $p_e$ at the various times may correspond to the average shaping level 221 for the data stored in the first region, and thus the health metric 216 for the at least the portion of the NVM 240 (e.g., for the first region).

In some examples, the controller 230 may be configured to determine the shaping levels of data without reading the data from the NVM 240. For example, the shaped data 228 may correspond to shaped data to be stored in the first region and the shaping unit 226 may provide the shaped data 228 to the shaping level engine on the controller 230. The shaping level engine may subsequently determine a shaping level of the shaped data 228 as described above (e.g., by counting 1-s of the shaped data 228) and may store an indication of the observed shaping level ($p_e$) in a management table (e.g., a logical to physical mapping table) stored by the data storage device 220. In these examples, prior to folding the shaped data 228 into the MLC portion 256, the comparator 214 may access the management table to determine an average shaping level for the at least the portion of the NVM 240 and/or may compare the average shaping level to the threshold. Thus, the data storage device 220 may be configured to determine a shaping level of data before transferring the data to the NVM 240.

Alternatively or additionally, the data storage device 220 may be configured to determine shaping levels of data after storing the data in the NVM 240. As an example, the shaped data 228 may be stored in the SLC portion 254. The NVM 240 may be configured to fold the shaped data 228 into a first region of the MLC portion 256. Prior to folding the shaped data 228 into the first region, the data 212/228 may be read from a first region of the NVM 240 and transferred to the controller 230 (e.g., to the shaping level engine). In this example, the shaping level engine may subsequently determine shaping levels (or an indication of the shaping levels $p_e$) of the shaped data 228 of the first region based on the data 212/228 read from the NVM as described above and may determine an average shaping level based on the determined shaping levels as described above. As another example, the NVM 240 may include on-chip circuitry, such as the counter 258. Prior to folding the shaped data 228 into the first region of the MLC portion 256, the data 212/228 may be read from the first region and provided to the counter 258. The counter 258 may be configured to determine shaping levels of the data 212/228 of the first region as described above. In this example, the NVM 240 may provide the shaping levels of the shaped data 228 stored in the first region as determined by the counter 258 (or an indication of the shaping level $p_e$) to the comparator 214, e.g., as health metric information 238, and the comparator 214 may determine the average shaping level of the at least the portion of the NVM 240 (e.g., of the first region) based on the health metric information 238. Alternatively, the NVM 240 may include circuitry to determine average shaping levels based on the shaping levels determined using the counter 258. Thus, the data storage device 220 may be configured to determine shaping levels of data after transferring the data to the NVM 240, and the shaping levels may be determined by the controller 230, by on-chip circuitry of the NVM 240, or both.

In some examples in which the health metric 216 corresponds to the count of the P/E cycles 218, the average BER 219, or the average shaping level 221, the threshold value may be selected based on a point at which the count of P/E cycles 218, the average BER 219, or the average shaping level 221, is indicative of a transition from a first wear level of the at least the portion of the NVM 240 to a second wear level of the at least the portion of the NVM 240. The first wear level may correspond to a wear level that will not result in more errors than the data storage device 220 can correct or otherwise compensate for if a problematic combination of logical pages of shaped data is stored at the at least the portion of the NVM 240 and the second wear level may correspond to a wear level that is likely to result in more errors than the data storage device 220 can correct or otherwise compensate for if the problematic combination is stored at the at least the portion of the NVM 240.

The controller 230 may determine that the health metric 216 for at least a portion of the NVM 240 (e.g., for at least one region of the one or more regions) satisfies the threshold value when the comparator 214 determines that the number of P/E cycles 218 performed to the at least the portion (e.g., to at least one region of the one or more regions) satisfies the threshold value, that the average BER 219 of the at least the portion (e.g., for at least one region of the one or more regions) satisfies the threshold, that the average shaping level 221 of the at least the portion (e.g., for at least one region of the one or more regions) satisfies the threshold, or a combination thereof. In response to the comparator 214 determining that the health metric 216 for the at least the portion of the NVM 240 satisfies the threshold, the controller 230 may discontinue shaping data to be stored at the at least the portion of the NVM 240. To illustrate, the one or more regions of the NVM 240 may include a first region including a group of blocks including the first block 1 and the second block 2 and a second region including a group of blocks including the third block 3 and the fourth block 4. In this example, when the controller 230 determines that the health metric 216 for the first region satisfies the threshold, the controller 230 may discontinue shaping data to be stored to the first region. In this example, the controller 230 may not determine that the health metric 216 for the second region satisfies the threshold, and thus may continue shaping data to be stored to the second region while discontinuing shaping data to be stored to the first region.

In some examples, the controller 230 may discontinue shaping data to be stored at the at least the portion of the NVM 240 for the remainder of the life of the NVM 240. For example, in response to the comparator 214 determining that the health metric 216 for the at least one region satisfies the threshold value, the controller 230 (e.g., the comparator 214) may issue a command or set one or more bits that will cause the controller 230 not to shape data to be stored to the at least the portion of the NVM 240 for the remainder of the life of the NVM 240. Thus, the controller 230 may experience benefits of shaping data to be stored at the at least the portion of the NVM 240, such as increased endurance and reduced average BER, while the health metric 216 for the at least the portion of the NVM 240 indicates that the at least the portion is fresh enough to not result in more errors (in response to the problematic combination) than the data storage device 220 can correct or otherwise compensate for, and may curb reliability issues associated with shaping data to be stored at the at least the portion by discontinuing shaping data to be stored at the at least the portion when the health metric 216 for the at least the portion indicates that the at least the portion is worn enough to experience a BER (in response to the problematic pattern) that the data storage device 220 may be incapable of correcting or otherwise compensate for.

After discontinuing shaping to the at least the portion of the NVM 240, the data storage device 220 may be configured to perform a scrambling operation on data to be stored at the at least the portion of the NVM 240. In some examples, the data storage device 220 may be configured to scramble data before transferring the data to the NVM 240. To illustrate, in some examples, when the comparator 214 determines that the at least the portion of the NVM 240 satisfies the health metric 216, the comparator 214 may route the data 212 to the scrambler 224 on the controller 230. The scrambler 224 may scramble the data 212 before storing the data 212 to the NVM 240.

Alternatively or additionally, the data storage device 220 may be configured to scramble data after transferring the data to the NVM 240. To illustrate, in some examples where the NVM 240 includes a scrambler 252, when the comparator 214 determines that the at least the portion of the NVM 240 satisfies the health metric 216, the controller 230 may route the data 212 to the NVM 240 without shaping or scrambling the data 212. The data 212 may be stored in the SLC portion 254 of the NVM 240. During a folding operation to fold the data 212 from the SLC portion 254 to the MLC portion 256, the data 212 may be read from the SLC portion 254 and provided to the scrambler 252, where the data 212 is scrambled into the scrambled data 232. The scrambled data 232 may subsequently be stored in the MLC portion 256. Alternatively, the NVM 240 may scramble the data 212 at the scrambler 252 prior to storing the data 212 at the SLC portion 254.

Figure 3:
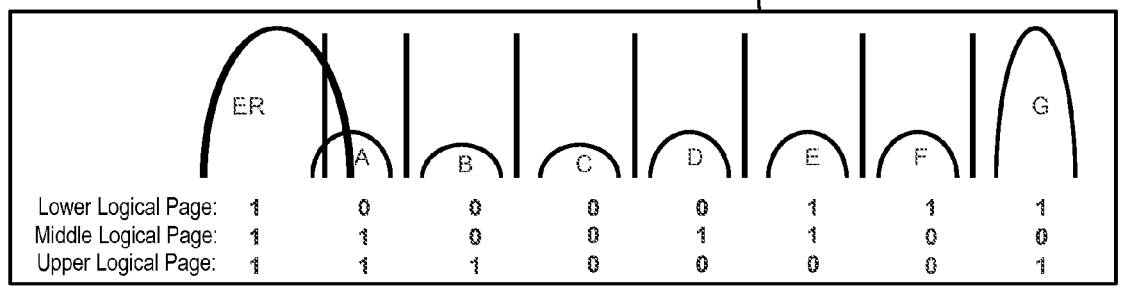
FIG. 3 is a general diagram depicting potentially problematic threshold voltage distribution patterns of shaped data.
Figure 3:
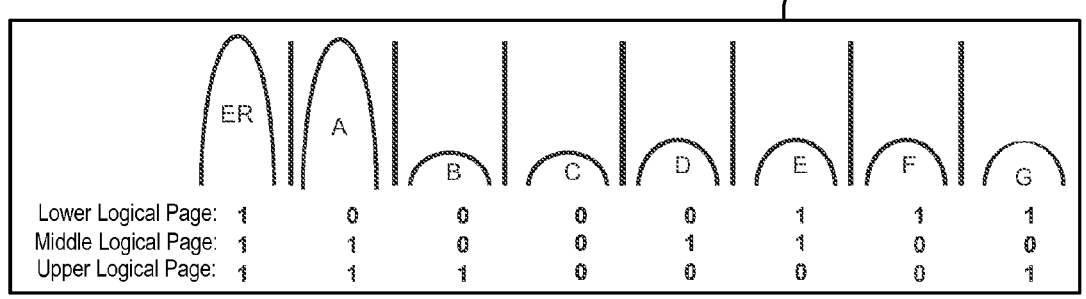
Figure 3:
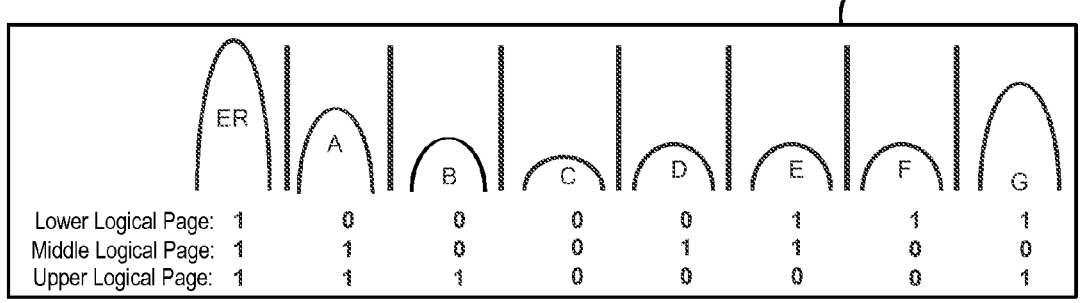

FIG. 3 illustrates three examples of distribution patterns 302, 304, and 306. The distribution patterns 302, 304, and 306 may correspond to potentially problematic distribution patterns associated with a combination of logical pages of shaped data, such as the shaped data 116 of FIG. 1 or the shaped data 228 of FIG. 2. For example, the potentially problematic distribution patterns may cause disturbs or other cell-to-cell interference. Each of the distribution patterns 302, 304, and 306 of FIG. 3 illustrates a different non-uniform distribution of cell states ER, A, B, C, D, E, F, and G and a corresponding mapping of bits to cell states for a combination of logical pages of different shaped data. An X-axis of the distribution patterns 302, 304, and 306 corresponds to cell threshold voltage, where a lowest threshold voltage corresponds to a left-most state (ER) and highest threshold voltage corresponds to a right-most state (G). A Y-axis corresponds to a number (or probability) of cells having a particular threshold voltage. An area of each lobe corresponds to a total number of cells programmed to the lobe's corresponding state.

For example, the shaped data 116 of FIG. 1 or the shaped data 228 of FIG. 2 may correspond to first data and the first distribution pattern 302 of FIG. 3 may correspond to a threshold voltage distribution pattern describing a combination of logical pages of the first data. For example, the first distribution pattern 302 may correspond to shaped data that has a lower logical page having a shaping level that corresponds to 90% ones (10% zeros), a middle logical page having a shaping level that corresponds to 50% ones (50% zeros), and an upper logical page having a shaping level that corresponds to 90% ones (10% zeros). A probability of the ER state may correspond to 40.5% (e.g., 0.9×0.5×0.9) and a probability of the G state may correspond to 40.5%. A large number of cells at the highest voltage state (the G state) increases a likelihood of bit errors due to cell-to-cell interference and mechanisms such as program disturb, which tends to shift cells in the ER state to higher threshold voltages. As illustrated in the first distribution pattern 302, cells in the ER lobe that have shifted across the ER-A state boundary are incorrectly read as being in the "A" state, thereby introducing bit errors to the stored data. To illustrate, the example shaping levels of 50%, 90%, and 90%, may correspond to a probability value of the ER state corresponding to 40.5% and a probability value of the G state corresponding to 40.5%. A probability of the ER and G states corresponding to 40% or greater may correspond to shaping levels that are considered to cause program disturb. Thus, lower, middle, and upper logical pages having shaping levels of 90%, 50%, and 90%, respectively, may be considered to cause problematic program disturb.

Alternatively, the shaped data 116 of FIG. 1 or the shaped data 228 of FIG. 2 may correspond to second data and the second distribution pattern 304 of FIG. 3 may correspond to a threshold voltage distribution pattern describing a combination of logical pages of the second data. The second distribution pattern 304 may correspond to shaped data that has a lower logical page having a shaping level that corresponds to 50% ones (50% zeros), a middle logical page having a shaping level that corresponds to 90% ones (10% zeros), and an upper logical page having a shaping level that corresponds to 90% ones (10% zeros). A large number of cells at neighboring cell states may increase a likelihood of bit errors due to cell-to-cell interference or other mechanisms. For example, cells in the ER lobe may be incorrectly read as being in the "A" state, thereby introducing bit errors to the stored data. To illustrate, the example shaping levels of 50%, 90%, and 90%, may correspond to a probability value of the ER state corresponding to 40.5% and a probability value of the A state corresponding to 40.5%. A probability of the neighboring pairs corresponding to 40% or greater may correspond to shaping levels that are considered to cause problematic overlap of the states. Thus, lower, middle, and upper logical pages having shaping levels of 50%, 90%, and 90%, respectively, may be considered to cause problematic overlap of the cell states.

Alternatively, the shaped data 116 of FIG. 1 or the shaped data 228 of FIG. 2 may correspond to third data and the third distribution pattern 306 of FIG. 3 may correspond to a threshold voltage distribution pattern describing a combination of logical pages of the third data. The third distribution pattern 306 may correspond to shaped data that has a lower logical page having a shaping level that corresponds to 60% ones (40% zeros), a middle logical page having a shaping level that corresponds to 55% ones (45% zeros), and an upper logical page having a shaping level that corresponds to 90% ones (10% zeros). The third distribution pattern 306 may represent a combination of relatively large ER, A, and G populations, and the program disturb and neighboring pair (e.g., adjacent-state) error mechanisms of the first and second distribution patterns 302 and 304 may cause the third distribution pattern 306 to be potentially problematic. To illustrate, the example shaping levels of 60%, 55%, and 90%, may correspond to a probability value of the ER state that corresponds to 29.7% (e.g., 0.6×0.55×0.90), a probability value of the A state that corresponds to 19.8% (e.g., 0.4×0.55×0.90), and a probability of the G state that corresponds to 24.3% (e.g., 0.60×0.45×0.90). A probability of the ER state greater than or equal to 28%, a probability of the A state greater than or equal to 19%, and a probability of the G state greater than or equal to 24% may be associated with a potentially problematic BER, such as may be empirically determined Thus, lower, middle, and upper logical pages having shaping levels of 60%, 55%, and 90%, respectively, may be considered a problematic combination of logical pages of shaped data for folding into a MLC page.

Although FIG. 3 illustrates threshold voltage distribution patterns for an MLC having 3-bits per cell (e.g., eight cell states), memory having a different number of bits per cell may be used. For example, the MLC may use two bits per cell or more than three bits per cell (e.g., four bits per cell). Although a particular mapping of bits to cells states is illustrated in FIG. 3, other bit to cell mappings may be employed and different shaping level combinations may cause disturbs or cell-to-cell interference in the other bit to cell mappings.

Figure 4:
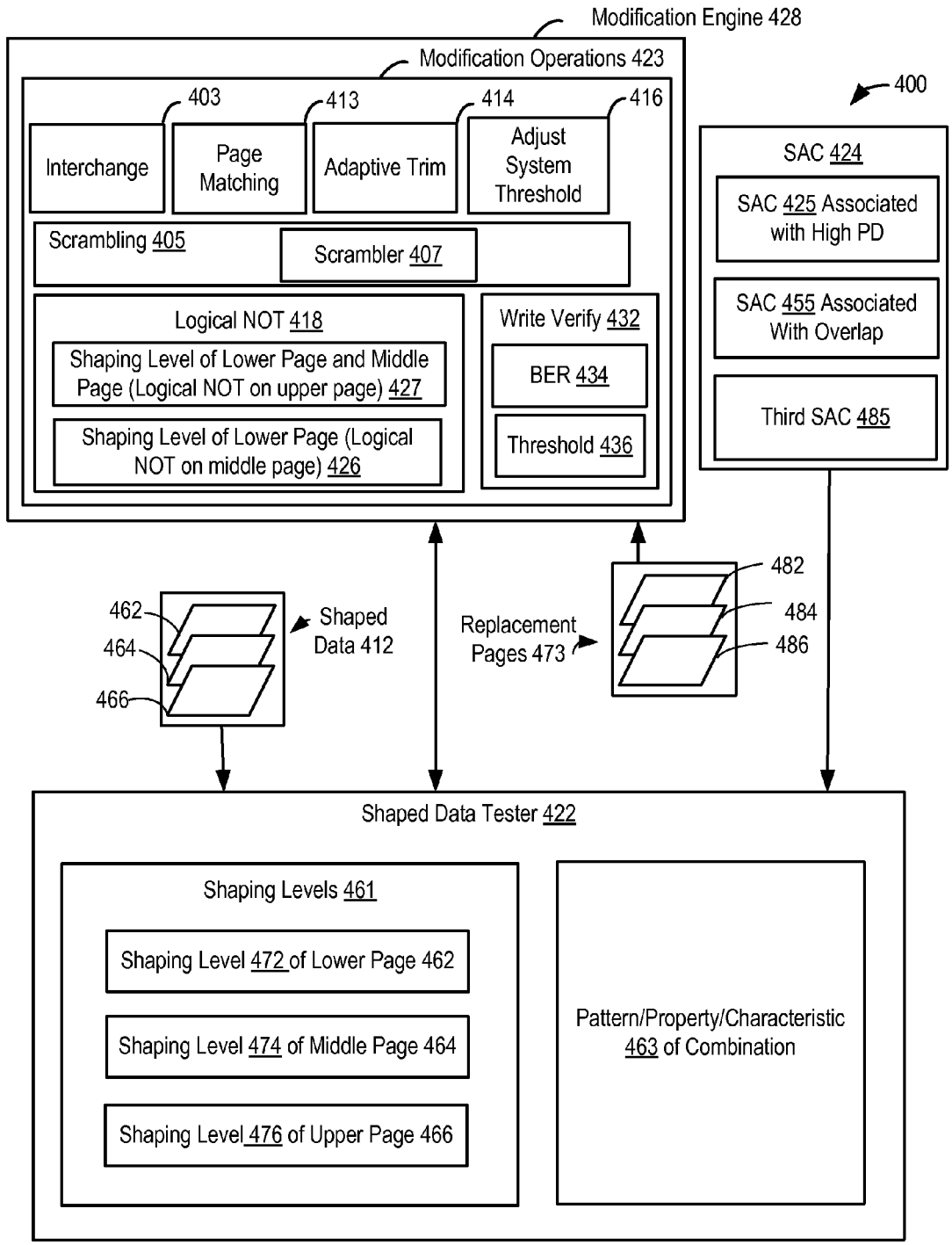
FIG. 4 is a block diagram of a particular embodiment of components of a system to perform a modification operation based on whether one or more shaping adjustment criteria are satisfied.

Components 400 of a data storage device configured to perform one or more modification operations based on a shaping level are illustrated in FIG. 4. The data storage device may include a controller and an NVM. For example, the data storage device may correspond to the system 100 of FIG. 1 including the controller 130 and the NVM 140. The components 400 of FIG. 4 include a shaped data tester 422, one or more shaping adjustment criteria 424, and a modification engine 428. The shaping adjustment criteria 424 may correspond to the shaping adjustment criteria 124 of FIG. 1.

One or more of the components 400 of FIG. 4 may be implemented using circuitry or sub-components on a controller of the data storage device, on a NVM of the data storage device, or both. For example, in some embodiments, the shaped data tester 422, the modification engine 428, and/or the shaping adjustment criteria 424 may be implemented using circuitry of, or may be stored by, the controller 130 of FIG. 1. For example, the shaped data tester 422 of FIG. 4 may correspond to the shaped data tester 122 of FIG. 1. Additionally or alternatively, the shaped data tester 422 of FIG. 4, the modification engine 428, and/or the shaping adjustment criteria 424 may be implemented using circuitry of, or may be stored by, the NVM 140 of FIG. 1. For example, the shaped data tester 422 of FIG. 4 may correspond to or include circuitry on the NVM that is configured to determine shaping levels. To illustrate, the shaped data tester 422 may correspond to or include the counter 153 of FIG. 1 and/or the shaped data tester 123. As another example, the modification engine 428 of FIG. 4 may include an on-chip scrambler on the NVM to perform scrambling. To illustrate, scrambler 407 may correspond to the scrambler 151 of FIG. 1.

The shaped data tester 422 of FIG. 4 may be configured to process shaped data (e.g., shaped data 412) to be folded into a physical page (e.g., the physical page 137 of FIG. 1) of an MLC of the NVM to determine shaping levels 461 of FIG. 4 of logical pages 462, 464, and 466 of the shaped data 412. For example, the shaped data tester 422 may process the shaped data 412 to determine a shaping level 472 of a lower logical page 462, a shaping level 474 of a middle logical page 464, and a shaping level 476 of an upper logical page 466. The shaped data (e.g., the shaped data 412) may correspond to data that includes at least one logical page of data having entropy less than (e.g., significantly less than) 1 as described above with reference to the shaped data 116 of FIG. 1. The shaping levels 461 of FIG. 4 of the logical pages 462, 464, and 466 of the shaped data 412 may correspond to the shaping levels described above with reference to the first distribution pattern 302 of FIG. 3, the shaping levels described above with reference to the second distribution pattern 304, the shaping levels described above with reference to the third distribution pattern 306, or other shaping levels.

In some examples, as described above, the shaped data tester 422 of FIG. 4 may determine the shaping levels 461 prior to providing the shaped data 412 to the NVM. For example, as described above with reference to FIG. 1, the shaped data tester 422 of FIG. 4 may determine the shaping levels 461 of the shaped data 412 before providing the shaped data 412 to the NVM 140 of FIG. 1, and the shaped data tester 422 of FIG. 4 may store the shaping levels 461 in management tables on the controller 130 of FIG. 1. Alternatively or additionally, the shaped data tester 422 of FIG. 4 may determine the shaping levels 461 of the shaped data 412 after providing the shaped data 412 to the NVM 140 of FIG. 1. In these examples, when a set of pages (e.g., 3 pages) in the SLC portion is set or scheduled to be folded into a physical page of the MLC portion, the SLC pages may be provided to the shaped data tester 422 of FIG. 4 (e.g., on the NVM or transferred to the controller), which may determine a shaping level of the pages.

The shaped data tester 422 may process the shaped data 412 having the shaping levels 461 to determine one or more properties, characteristics, or distribution patterns 463 of a combination of the logical pages 462, 464, and 466 of the shaped data 412. The distribution patterns may correspond to threshold voltage distribution patterns and the properties or characteristics may correspond to a probability of one or more cell states associated with the logical pages of the shaped data 412. For example, the shaped data tester 422 may process the lower logical page 462, the middle logical page 464, and the upper logical page 466 using the shaping levels 461 of the shaped data 412 to determine a threshold voltage distribution pattern of the shaped data 412 and/or a characteristic or property corresponding to a probability for one or more cell states (e.g., ER, A, B, C, D, E, F, and G as illustrated in FIG. 3 associated with the shaped data 412 of FIG. 4).

To illustrate, the shaped data 412 may correspond to the first data described above with reference to the first distribution pattern 302 of FIG. 3 and the shaping levels 461 of FIG. 4 may correspond to the first shaping levels described above with reference to the first distribution pattern 302 of FIG. 3. The shaped data tester 422 of FIG. 4 may process the first data using the first shaping levels to determine the distribution pattern 302 of FIG. 3. The characteristic, property, or distribution pattern 463 of FIG. 4 of the shaped data 412 may correspond to the distribution pattern 302 of FIG. 3. Additionally or alternatively, the characteristic, property, or distribution pattern 463 of FIG. 4 of the shaped data 412 may correspond to a probability value of the ER state that corresponds to 40.5% (e.g., 0.9×0.5×0.9) and a probability value of the G state that corresponds to 40.5%. A probability of the ER state corresponding to 40.5% or greater and a probability of the G state corresponding to 40.5% or greater may correspond to shaping levels that are considered to stress the ER state and cause a high BER.

As another example, the shaped data 412 may correspond to the second data described above with reference to the second distribution pattern 304 of FIG. 3 and the shaping levels 461 of FIG. 4 may correspond to the second shaping levels described above with reference to the second distribution pattern 304 of FIG. 3. The shaped data tester 422 of FIG. 4 may process the second data using the second shaping levels to determine the second distribution pattern 304 of FIG. 3. The characteristic, property, or distribution pattern of the shaped data 412 of FIG. 4 may correspond to the second distribution pattern 304 of FIG. 3. Additionally or alternatively, the characteristic, property, or distribution pattern of the shaped data 412 of FIG. 4 may correspond to a probability value of the ER state that corresponds to 40.5% (e.g., 0.9×0.5×0.9) and a probability value of the A state that corresponds to 40.5%. A probability of the neighboring pairs corresponding to 40.5% or greater may correspond to shaping levels that are considered to cause problematic overlap of the states.

As a third example, the shaped data 412 may correspond to the third data described above with reference to the third distribution pattern 306 of FIG. 3 and the shaping levels 461 of FIG. 4 may correspond to the third shaping levels described above with reference to the third distribution pattern 306 of FIG. 3. The shaped data tester 422 of FIG. 4 may process the third data using the third shaping levels to determine the third distribution pattern 306 of FIG. 3. The characteristic, property, or distribution pattern of the shaped data 412 of FIG. 4 may correspond to the second distribution pattern 306 of FIG. 3. Additionally or alternatively, the characteristic, property, or distribution pattern of the shaped data 412 of FIG. 4 may correspond to a probability value of the ER state that corresponds to 29.7% (e.g., 0.6×0.55× 0.90), a probability value of the A state that corresponds to 19.8% (e.g., 0.4×0.55×0.90), and a probability of the G state that corresponds to 24.3% (e.g., 0.60×0.45×0.90).

Thus, the shaped data tester 422 may determine a characteristic, property, or distribution pattern 463 associated with the shaped data 412 using the shaping levels of the shaped data 412. Other characteristics or properties or cell states, or other number of cell states, may be determined by the shaped data tester 422 using the shaping levels of the logical pages of the shaped data 412.

The shaped data tester 422 may compare the shaping levels 461 of the shaped data 412 and/or the characteristic, property, or distribution pattern 463 associated with the shaped data 412 to one or more of the shaping adjustment criteria 424. The shaping adjustment criteria 424 associated with the modification operations 423 may correspond to, include, or be based on (e.g., derived from) threshold voltage distribution patterns (including particular probabilities of one or more cell states of distribution patterns) that are problematic (e.g., may induce unacceptable bit error rate (BER)). In some examples, the shaping adjustment criteria 424 may correspond to shaping levels of logical pages. For example, the shaping adjustment criteria 424 may include one or more sets of shaping level values indicative of potentially problematic combinations of logical pages. Additionally or alternatively, the shaping adjustment criteria 424 may correspond to (or may include some criteria that correspond to) distribution patterns indicative of potentially problematic combinations of logical pages. The distribution patterns may include particular probabilities for one or more cell states that are indicative of problematic combinations. Alternatively or additionally to the shaping adjustment criteria 424 corresponding to an entire distribution pattern, the shaping adjustment criteria 424 may correspond to particular probability values for one or more cell states.

In some examples, the potentially problematic combinations of logical pages may include combinations that correspond to (e.g., would result in) threshold voltage distribution patterns having levels of a ER state and/or a G state associated with inducing program disturb. To illustrate, a shaping adjustment criteria 425 may correspond to a set of shaping levels (e.g., of logical pages to be folded into a physical page) that, in combination, correspond to (e.g., would result in) a threshold voltage distribution pattern having particular probability levels of an ER state and a G state. For example, heuristic evaluation of a particular NVM (e.g., the NVM 140 of FIG. 1) may indicate that a combination of logical pages that correspond to a threshold distribution pattern having a probability of the ER state greater than or equal to 40% and a probability of the G state greater than or equal to 40% is associated with a probability of a program disturb being 60%, which may be unacceptably high. The shaping adjustment criteria 425 of FIG. 4 may thus be selected to correspond to a set of shaping levels of logical pages that would result in a threshold voltage distribution pattern having a probability value of the Erase state and the G state each being greater than or equal to 40%.

As another example, the potentially problematic combinations may include combinations that correspond to (e.g., would result in) threshold voltage distribution patterns having a pair of neighboring cell states that have probabilities associated with inducing an overlap between the pair of neighboring cell states. To illustrate, a shaping adjustment criteria 455 may correspond to a set of shaping levels (e.g., of logical pages to be folded into a physical page) that, in combination, correspond to (e.g., would result in) a threshold voltage distribution pattern having particular probability levels of an ER state and an A state. For example, heuristic evaluation of a particular NVM (e.g., the NVM 140 of FIG. 1) may indicate that a combination of logical pages that correspond to a threshold voltage distribution pattern having a probability of the ER state being greater than 40% and a probability of the A state being greater than 40% is associated with a probability of experiencing a problematic overlap of the states being 60%, which may be unacceptably high. The shaping adjustment criteria 455 of FIG. 4 may thus be selected to correspond to one or more shaping levels that would result in a threshold voltage distribution pattern having a probability of the ER state and the A state each being greater than or equal to 40%.

As another example, the potentially problematic combinations may include combinations that correspond to (e.g., would result in) threshold voltage distribution patterns having particular probability levels of an ER state, an A state, and a G state. For example, heuristic evaluation of a particular NVM (e.g., the NVM 140 of FIG. 1) may indicate that a combination of logical pages that correspond to a threshold voltage distribution pattern having a probability of the ER state greater than or equal to 28%, a probability of the A state greater than or equal to 19%, and a probability of the G state greater than or equal to 24% is associated with a probability of a high number of bit errors. The shaping adjustment criteria 485 of FIG. 4 may thus be selected to correspond to one or more shaping levels that would result in a threshold voltage distribution pattern having a probability of the ER state being greater than 28%, a probability of the A state being greater than or equal to 19%, and a probability of the G state being greater than or equal to 24%.

Of course, the particular shaping levels, states and state probability levels described herein are merely illustrative and should not be considered to be restrictive of shaping levels or the shaping adjustment criteria 424. Additionally, although the shaping adjustment criteria 424 are described above using example shaping adjustment criteria that are indicative of a high program disturb and/or a problematic cell state overlap, the shaping adjustment criteria 424 may include one or more shaping adjustment criteria that are indicative of other causes or markers of bit errors. Additionally, although the cell states of the shaping adjustment criteria 424 are described above as including the ER state, the G state, and/or the A state, one or more shaping adjustment criteria of the shaping adjustment criteria 424 may be defined without using probabilities of one or more of the ER state, the A state, or the G state, or may be defined using probabilities of one or more other cell states additional to the ER state, the A state, or the G state. Furthermore, although the cell states of the shaping adjustment criteria 424 are described with reference to particular shaping level combination probabilities, one or more different probability values may be used and the exemplary probabilities described herein for illustration purposes should not be considered as being restrictive.

In some examples, the shaped data tester 422 may determine whether the combination of the logical pages 462, 464, and 466 satisfies the shaping adjustment criteria 424 before transferring the shaped data 412 to the NVM. To illustrate, the controller, e.g., the controller 130 of FIG. 1, may determine (before transferring the shaped data 412 of FIG. 4 to the NVM) that the shaped data 412 is to be folded into a single physical page of the MLC portion of the NVM. A shaping unit on the controller (e.g., the shaping unit 114 of FIG. 1) may provide the shaped data to the shaped data tester 422 of FIG. 4 prior to transferring the shaped data 412 to the NVM, and the shaped data tester 422 may determine shaping levels as described above. The shaped data tester 422 may then determine whether the shaped data 412 satisfies the shaping adjustment criteria 424 as described above. Thus, the shaped data tester 422 may determine whether the combination of the logical pages 462, 464, and 466 satisfies the shaping adjustment criteria 424 before transferring the shaped data 412 to the NVM.

In other examples, the shaped data tester 422 may determine whether the combination of the logical pages 462, 464 and 466 satisfies the shaping adjustment criteria 424 after transferring the shaped data 412 to the NVM using stored shaping levels. For example, the shaped data tester 422 may determine shaping levels of the shaped data 412 and store the shaping levels in a management table before transferring the shaped data 412 to the NVM as described above. After storing the logical pages 462, 464, and 466 in the SLC portion of the NVM, the NVM may inform the controller that the logical pages 462, 464, and 466 of the shaped data 412 are set or scheduled to be folded into a physical page of the MLC portion. The shaped data tester 422 may access the shaping levels 461 of the logical pages 462, 464, and 466 stored in the management tables and may determine whether the combination of the logical pages 462, 464, and 466 satisfies the shaping adjustment criteria 424 based on the shaping level information in the management tables.

Alternatively or additionally, the shaped data tester 422 may determine whether the combination of the logical pages 462, 464, and 466 satisfies the shaping adjustment criteria 424 after transferring the shaped data 412 to the NVM without using stored shaping levels. In these examples, after storing the logical pages 462, 464, and 466 in the SLC portion of the NVM, the NVM may inform the controller that the logical pages 462, 464, and 466 of the shaped data 412 are set or scheduled to be folded into a physical page of the MLC portion. The logical pages 462, 464, and 466 may be provided to the shaped data tester 422. The shaped data tester 422 may determine the shaping levels 461 as described above and may determine whether the shaped data 412 satisfies the shaping adjustment criteria without storing the shaping levels in memory of the controller 130 of FIG. 1.

The modification engine 428 of FIG. 4 may be configured to modify the shaped data 412 (or otherwise perform a modification operation such as adjusting a system threshold) prior to folding the data into a cell of an MLC portion of a NVM, such as the MLC portion 136 of the NVM 140 of FIG. 1, based on the shaped data tester 422 of FIG. 4 determining that the shaped data 412 satisfies at least one of the shaping adjustment criteria 424. For example, the modification engine 428 may be configured to perform an interchange operation 403, a page matching operation 413, an adaptive trim operation 414, a logical NOT operation 418, a scrambling operation 405, a write verify trigger operation 432, or an operation that adjusts one or more system thresholds (an adjust system threshold operation 416).

The modification engine 428 may be configured with the capability to perform one of the modification operations 423 or more than one of the modification operations 423. When the modification engine 428 is configured with the capability to perform multiple of the modification operations 423, each of the multiple modification operations may correspond to distinctive shaping adjustment criteria, and the multiple modification operations may be selectively performed based on the particular shaping adjustment criteria satisfied by the shaped data 412. For example, when the modification engine 428 is configured to selectively perform the interchange operation 403 and the logical NOT operation 418, the modification engine 428 may perform the interchange operation 403 in response to determining that the shaped data satisfies the shaping adjustment criteria 425 and may alternatively perform the logical NOT operation 418 in response to determining that the shaped data satisfies the shaping adjustment criteria 455.

Interchange Operation

The interchange operation 403 may include interchanging one or more logical pages of the shaped data 412 prior to storing the shaped data to a physical page of a multi-level cell portion of the non-volatile memory (e.g., to the physical page 137 of the MLC portion 136 of the NVM 140 of FIG. 1). The interchange operation 403 of FIG. 4 may be performed in response to the shaped data tester 422 determining that the shaped data 412 satisfies at least one of the shaping adjustment criteria 424 that corresponds to an unacceptably high probability of program disturb. For example, the interchange operation 403 may be performed in response to the shaped data tester 422 determining that the shaped data 412 satisfies the shaping adjustment criteria 425. To illustrate, the lower logical page 462, the middle logical page 464, and the upper logical page 466 may be set or scheduled to be folded into a physical page of an MLC portion of the NVM. In response to determining that the combination of the logical pages 462, 464, and 466 satisfies the shaping adjustment criteria 425, the logical pages 462, 464, and 466 may be provided to the modification engine 428, which may cause one or more of the logical pages 462, 464, and 466 to be interchanged.

In some implementations, the modification engine 428 may use a lookup table (LUT) or other stored data structure to select the interchange operation 403 based on which particular shaping adjustment criteria 424 is determined to be satisfied. For example, if the shaping adjustment criteria 425 is satisfied, the modification engine 428 may access the LUT and locate an entry corresponding to the shaping adjustment criteria 425 that indicates an interchange of the upper logical page 466 with the middle logical page 464. Alternatively, the modification engine 428 may be configured to analyze multiple interchange configurations, combinations, or permutations to determine an interchange combination. For example, the modification engine 428 may analyze a first interchange combination in which the upper logical page 466 is interchanged with the middle logical page 464, resulting in a probability of 4.5% (e.g., 0.9×0.1× 0.5) for the G state. The modification engine 428 may determine to use the first interchange combination because the combination does not satisfy the shaping adjustment criteria 425 (or any of the shaping adjustment criteria 424). For example, the modification engine 428 may determine to use the first interchange combination because the G state of the first interchanged combination is not greater than or equal to 40%.

Additionally or alternatively, the modification engine 428 may be configured to determine an interchange combination based on whether the lower logical page 462 has the highest shaping level of the logical pages 462, 464, and 466 of the shaped data 412. For example, when lower logical page 462 does not have the highest shaping level of the logical pages 462, 464, and 466 of the shaped data 412, the modification engine 428 may be configured to determine an interchange combination that interchanges the lower logical page 462 with the logical page of the logical pages 464 and 466 having the highest shaping level. To illustrate, the middle logical page 462 may have the highest shaping level of the logical pages 462, 464, and 466. Based on the combination of the logical pages 462, 464, and 466 satisfying the one or more criteria of the shaping adjustment criteria 424 associated with the interchange operation 403 and the middle logical page 462 having the highest shaping level, the modification engine 428 may determine an interchange configuration (e.g., a second interchange configuration) in which the middle logical page 464 is interchanged with the lower logical page 462.

Subsequent to determining the interchange combination, the modification engine 428 may determine to proceed using the interchanged combination. For example, the modification engine 428 may provide the shaped pages (e g, unmodified shaped pages) to the NVM along with an instruction that, when executed by the NVM, causes the NVM to fold the shaped pages into a physical page of the MLC portion based on the interchanged configuration. Alternatively or additionally, the modification engine 428 may perform the interchange operation and may provide the interchanged combination of pages to the NVM, which may fold the interchanged combination of the pages into a physical page of the MLC portion. Thus, the lower logical page 462, the middle logical page 464, and the upper logical page 466 of the shaped data 412 may be folded into a physical page of the MLC portion according to the interchanged configuration.

The reordering or interchange configuration may be recorded by the data storage device 120 of FIG. 1. For example, the data storage device 120 may maintain a record of the reordering in a management table [not illustrated].

Page Matching

The page matching operation 413 of FIG. 4 may include identifying a page of the shaped data 412 as being a problematic page in the context of the combination of the logical pages 462, 464, and 466 of the shaped data 412 and determining a suitable replacement logical page for the problematic page that in combination with the remaining pages of the shaped data 412 results in an acceptable combination. The page matching operation 413 may be performed when the combination of the logical pages of the shaped data 412 satisfies one or more criteria of the shaping adjustment criteria 424 associated with the page matching operation 413. For example, the page matching operation 413 may be performed when the combination of the logical pages 462, 464, and 466 of the shaped data 412 satisfies one or more shaping adjustment criteria of the shaping adjustment criteria 424 that correspond to an unacceptably high probability of problematic overlap of neighboring states. For example, the page matching operation 413 may be performed in response to the shaped data tester 422 determining that the shaped data 412 satisfies the shaping adjustment criteria 455. To illustrate, the lower page 462, the middle page 464, and the upper page 466 may be set or scheduled to be folded into a physical page of an MLC portion of the NVM (e.g., the physical page 137 of the MLC portion 136 of the NVM 140 of FIG. 1), and the shaped data tester 422 of FIG. 4 may determine that the combination of the lower, middle, and upper pages 462, 464, and 466 results in a probability of 40.5% for the ER state and a probability of 40.5% for the A state as described above with reference to the second distribution pattern 304 of FIG. 3. The shaped data tester 422 of FIG. 4 may determine that the combination of the lower logical page 462, the middle logical page 464, and the upper logical page 466 satisfies the shaping adjustment criteria 455 because the determined probability of 40.5% for the ER state is greater than 40% and the determined probability of 40.5% for the A state is greater than 40%.

In response to determining that the combination of the logical pages 462, 464, and 466 satisfies the shaping adjustment criteria 455, the logical pages 462, 464, and 466 may be provided to the modification engine 428, which may determine which logical page of the logical pages 462, 464, and 466 will be replaced (e.g., a "problematic page") and search for a logical page (e.g., a "replacement page") to replace the problematic page. For example, the modification engine 428 may identify the middle logical page 464 as the problematic pattern and search one or more logical pages of one or more potential replacement logical pages 482, 484, and 486 (e.g., logical pages scheduled for storage into the MLC) to identify a suitable replacement page. For example, the potential replacement logical page 482 may have a shaping level of 89%, the potential replacement logical page 484 may have a shaping level of 95%, and the potential replacement logical page 486 may have a shaping level of 55%.

The modification engine 428 may evaluate the suitability of using the potential replacement logical page 482 as the replacement page. The modification engine 428 may determine that using the potential replacement logical page 482 as a replacement for the middle logical page 464 results in combination (e.g., lower logical page 462, the potential replacement logical page 482 as a middle logical page, and upper logical page 466) that includes a probability of 40.05% for the ER state and a probability of 40.05% for the A state. The modification engine 428 may determine not to use the potential replacement logical page 482 as the replacement page because the combination results in probabilities of the ER state and the A state that satisfy the shaping adjustment criteria 455 (e.g., the probabilities of the ER and A states exceed 40%).

The modification engine 428 may evaluate the suitability of using the potential replacement logical page 484 as the replacement page. The modification engine 428 may determine that using the logical page 484 results in a combination of logical pages (e.g., lower logical page 462, the potential replacement logical page 484 as a middle logical page, and upper logical page 466) having a probability of 42.75% for the ER state and a probability of 42.75% for the A state. The modification engine 428 may determine not to use the potential replacement logical page 484 as the replacement page because the combination results in probabilities of the ER state and the A state that satisfy the shaping adjustment criteria 455 (e.g., the probabilities of the ER and A states exceed 40%).

The modification engine 428 may evaluate the suitability of using the logical page 386 as the replacement page. The modification engine 428 may determine that using the potential replacement logical page 486 results in a probability of 24.75% for the ER state and a probability of 24.75% for the A state. The modification engine 428 may determine to use the potential replacement logical page 486 as the replacement page because the combination results in probabilities of the ER state and the A state that do not satisfy the shaping adjustment criteria 455 (e.g., the probabilities of the ER and A states do not exceed 40%).

The modification engine 428 may determine to proceed using the lower logical page 462, the potential replacement logical page 486 as a middle logical page, and the upper logical page 466. For example, the modification engine 428 may provide the logical pages 462, 486, and 466 to the NVM along with an instruction that, when executed by the NVM, causes the NVM to fold the logical pages 462, 486, and 466 into a physical page of the MLC portion. The modification engine 428 may add the middle logical page 464 to the potential replacement pages 473.

Adaptive Trim

The adaptive trim operation 414 may include determining one or more trim parameters to modify, determining an amount to modify the determined trim parameter, and modifying the determined trim parameter the determined amount. The trim parameters may include write line/bit line voltages, program verify voltage levels, read reference values, or any other trim parameter. With reference to FIG. 3, the program verify voltage levels may correspond to the leftmost edge of the cell states A, B, C, D, E, F, and G or a voltage between the leftmost edge and a center of each state.

The adaptive trim operation 414 of FIG. 4 may be performed when the combination of the logical pages 462, 464, and 466 of the shaped data 412 satisfies one or more criteria of the shaping adjustment criteria 424 associated with the adaptive trim operation 414. For example, the adaptive trim operation 414 may be performed when the combination of the logical pages 462, 464, and 466 of the shaped data 412 satisfies one or more of the shaping adjustment criteria 424 that correspond to an unacceptably high probability of overlap of neighboring states (e.g., the shaping adjustment criteria 455) and/or in response to one or more of the shaping adjustment criteria 424 that correspond to an unacceptably high probability of program disturb (e.g., the shaping adjustment criteria 425). Additionally or alternatively, the adaptive trim operation 414 may be performed when the combination of the logical pages of the shaped data 412 satisfies the shaping adjustment criteria 485. To illustrate, the lower page 462, the middle page 464, and the upper page 466 may be set or scheduled to be folded into a physical page of an MLC portion of the NVM (e.g., into the physical page 137 of the MLC portion 136 of the NVM 140 of FIG. 1), and the shaped data tester 422 of FIG. 4 may determine that the combination of the lower, middle, and upper pages 462, 464, and 466 results in a probability of 29.7% for the ER state, a probability of 19.8% for the A state, and a probability of 24.3% for the G state as described above with reference to the third distribution pattern 306 of FIG. 3. The shaped data tester 422 of FIG. 4 may determine that the combination of the lower logical page 462, the middle logical page 464, and the upper logical page 466 satisfies the shaping adjustment criteria 485 because the determined probability of 29.7% for the ER state is greater than 28% as defined by the shaping adjustment criteria 485, the determined probability 19.8% for the A state is greater than 19% as defined by the shaping adjustment criteria 485, and the determined probability of 24.3% for the G state is greater than 24% as defined by the shaping adjustment criteria 485.

In response to determining that the combination of the logical pages 462, 464, and 466 satisfies at least one of the shaping adjustment criteria 424 associated with the adaptive trim operation 414, the logical pages 462, 464, and 466 may be provided to the modification engine 428, which may determine which trim parameter to modify (e.g., selected trim parameters). For example, the modification engine 428 may determine to modify a program verify voltage level of the A state, the B state, and the G state.

The modification engine 428 may determine modified values for the selected trim parameters. For example, the modification engine 428 may determine to increase a program verify voltage of the A state to a first particular value to increase a separation between the ER an A states, to increase a program verify voltage of the B state to a second particular value to increase separation between the A and B states, and to decrease a program verify voltage of the G state to a third particular value to reduce a programming voltage of cells in the G state. As other examples, the adaptive trim operation 414 may increase a number of program pulses to more tightly cluster cells into a center of a cell state, or may include one or more other adjustments to reduce errors associated with the shaping adjustment criteria 424.

The modification engine 428 may store the determined trim parameter values in a controller of a data storage device or the NVM. The data storage device (e.g., the data storage device 120 of FIG. 1) may apply the determined trim parameters when interacting with cells of the NVM in which the shaped data 412 of FIG. 4 is folded.

Logical NOT

The logical NOT operation 418 may include identifying one or more of the logical pages 462, 464, and 466 of the shaped data 412 on which to perform a logical NOT operation and performing the logical NOT operation on bit values (e.g., the bit values 118 of FIG. 1) of one or more of the logical pages 462, 464, and 466 of the shaped data 412 prior to storing the shaped data 412 to a physical page of an MLC portion of an NVM (e.g., the physical page 137 of the MLC portion 136 of the NVM 140 of FIG. 1). The logical NOT operation 418 of FIG. 4 may be performed when the combination of the logical pages 462, 464, and 466 of the shaped data 412 satisfies one or more criteria of the shaping adjustment criteria 424 associated with the logical NOT operation 418. For example, the logical NOT operation 418 may be performed when the combination of the logical pages 462, 464, and 466 of the shaped data 412 satisfies one or more shaping adjustment criteria of the shaping adjustment criteria 424 that correspond to an unacceptably high probability of program disturb or when the combination satisfies one or more shaping adjustment criteria of the shaping adjustment criteria 424 that correspond to an unacceptably high probability of problematic overlap of neighboring states. For example, the logical NOT operation 418 may be performed in response to the shaped data tester 422 determining that the shaped data 412 satisfies the shaping adjustment criteria 455, the shaping adjustment criteria 425, or the shaping adjustment criteria 485, as described above.

In response to determining that the combination of the logical pages 462, 464, and 466 satisfies one or more shaping adjustment criteria of the shaping adjustment criteria 424 associated with the logical NOT operation 418, the shaped data 412 may be provided to the modification engine 428. The modification engine 428 may determine to which logical page of the shaped data 412 to perform the logical NOT operation 418. Performing the logical NOT operation 418 may transform the logical page on which the logical NOT operation is performed into a "transformed page", and a set of logical pages including the transformed logical page may be a "modified set" of the shaped data 412.

For example, when the shaped data 412 satisfies one or more criteria of the shaping adjustment criteria 424 that are associated with the logical NOT operation 418, the logical NOT operation 418 may be performed on the middle logical page 464 based on a shaping level of the lower logical page 462 satisfying a first threshold. To illustrate, the modification engine 428 may determine to perform the logical NOT operation 418 on the middle logical page 464 when a shaping level of the lower logical page 462 is about 50% (or less). The modification engine 428 may generate a transformed middle logical page by performing a bit-wise logical NOT on data of the middle logical page 464. In this example, the modified set of the shaped data 412 may correspond to the lower logical page 462, the transformed middle logical page, and the upper logical page 466 (e.g., a "first modified set").

As another example, when the shaped data 412 satisfies one or more criteria of the shaping adjustment criteria 424 that are associated with the logical NOT operation 418, the logical NOT operation 418 may be performed on the upper logical page 466 when a shaping level of the lower logical page 462 satisfies a second threshold and a shaping level of the middle logical page 464 satisfies a third threshold, where the third threshold is less than the second threshold. To illustrate, the modification engine 428 may determine to perform the logical NOT operation 418 on the upper logical page 466 when a shaping level of the lower logical page 462 is greater than or equal to about 90% and a shaping level of the middle logical page 464 is less than or equal to about 50%. The modification engine 428 may generate a transformed upper logical page by performing a logical NOT on data of the upper logical page 466. In this example, the modified set of the shaped data 412 may correspond to the lower logical page 462, the middle logical page 464, and the transformed upper logical page (e.g., a "second modified set").

Scrambling

The scrambling operation 405 may include scrambling one or more logical pages of the shaped data 412 using a scrambler 407. The scrambler 407 may correspond to a linear feedback shift register (LFSR) configured to generate a pseudo-random sequence of bit values that are XOR'ed with the input data to generate scrambled data. The scrambling operation 405 may be performed when the combination of the logical pages 462, 464, and 466 of the shaped data 412 satisfies one or more criteria of the shaping adjustment criteria 424 that are associated with the scrambling operation 405. For example, the scrambling operation 405 may be performed when the combination of the logical pages 462, 464, and 466 of the shaped data 412 satisfies one or more criteria of the shaping adjustment criteria 424 that correspond to an unacceptably high probability of program disturb or when the combination satisfies one or more criteria of the shaping adjustment criteria 424 that correspond to an unacceptably high probability of problematic overlap of neighboring states. For example, the scrambling operation 405 may be performed in response to the shaped data tester 422 determining that the shaped data 412 satisfies the shaping adjustment criteria 425, the shaping adjustment criteria 455, or the shaping adjustment criteria 485, as described above. Based on determining that the combination satisfies one or more criteria of the shaping adjustment criteria 424 associated with the scrambling operation 405, the shaped data 412 may be scrambled.

The shaped data tester 422 may determine the shaping levels without reading the shaped data 412 from an NVM (e.g., the NVM 140 of FIG. 1) as described above with reference to FIG. 1 (e.g., the shaped data tester 422 of FIG. 4 stores the shaping levels in a management table). A controller (e.g., the controller 130 of FIG. 1) may, in response to determining that the combination satisfies one or more criteria of the shaping adjustment criteria 424 of FIG. 4 associated with the scrambling operation 405, cause the NVM to read the shaped data 412 and provide the shaped data 412 to a scrambler implemented on the controller or to a scrambler implemented on the NVM. For example, the modification engine 128 of FIG. 1 may include a scrambler and the NVM may read the shaped data 412 of FIG. 4 from an SLC portion (e.g., the SLC portion 134 of FIG. 1) of the NVM and transfer the shaped data 412 of FIG. 4 to the scrambler of the modification engine. The scrambler of the modification engine may scramble the shaped data 412 and provide the scrambled data to the NVM to be stored in a physical page (e.g., the physical page 137 of FIG. 1) of the MLC portion. Alternatively, the controller may determine before transferring the shaped data 412 of FIG. 4 to the NVM that the shaped data 412 is to be folded into the physical page of the MLC portion of the NVM prior to the shaped data 412 being transferred to the NVM. In this example, the modification engine 428 may scramble the shaped data 412 prior to transferring the shaped data to the NVM.

Alternatively or additionally, the shaped data tester 422 may determine the shaping levels of the shaped data 412 after transferring the shaped data 412 to the NVM (e.g., by using the shaped data 412 read from the NVM) as described above with reference to FIG. 1. In this example, the scrambler of the modification engine 428 or a scrambler (e.g., the scrambler 151 of FIG. 1) of the NVM may scramble the shaped data 412 of FIG. 4 and provide the scrambled data to the NVM to be stored in the physical page of the MLC portion.

Write Verify

The write verify trigger operation 432 may include causing, triggering, instructing, inducing, or taking action toward performance of at least a portion of a write verify operation on one or more of the logical pages 462, 464, and 466 of the shaped data 412. The write verify trigger operation 432 may be performed when the combination of the logical pages of the shaped data 412 satisfies one or more criteria of the shaping adjustment criteria 424 that are associated with the write verify operation 432. For example, the write verify trigger operation 432 may be performed when the combination of the logical pages 462, 464, and 466 of the shaped data 412 satisfies one or more criteria of the shaping adjustment criteria 424 that correspond to an unacceptably high probability of program disturb or when the combination satisfies one or more criteria of the shaping adjustment criteria 424 that correspond to an unacceptably high probability of problematic overlap of neighboring states. For example, the write verify trigger operation 432 may be performed in response to the shaped data tester 422 determining that the shaped data 412 satisfies the shaping adjustment criteria 425, the shaping adjustment criteria 455, or the shaping adjustment criteria 485, as described above.

In response to determining that the combination of the logical pages 462, 464, and 466 satisfies one or more criteria of the shaping adjustment criteria 424 that are associated with the write verify trigger operation 432, the modification engine 428 may trigger performance of at least a portion of the write verify operation on a block in which the shaped data 412 is stored. For example, in response to determining that at least one criteria of the shaping adjustment criteria 424 that is associated with the write verify trigger operation 432 is satisfied, the modification engine 428 may issue a command causing or instructing a controller (e.g., the controller 130 of FIG. 1) or an NVM (e.g., the NVM 140 of FIG. 1) to perform at least a portion of the write verify operation.

The at least the portion of the write verify operation may include reading (e.g., by the NVM) a copy (e.g., a "first copy") of the shaped data 412 of FIG. 4 from a first physical page of the MLC portion of the NVM (e.g., from the physical page 137 of the MLC portion 136 of the NVM 140 of FIG. 1). The at least the portion of the write verify operation may additionally or alternatively include transferring the first copy of the shaped data 412 of FIG. 4 that is read by the NVM (e.g., the "read back data") to the controller to determine errors in the read back data. The at least the portion of the write verify operation may additionally or alternatively include the controller checking for errors either by comparison with an original copy of the shaped data 412 which may be cached in an SLC portion of the NVM (e.g., the SLC portion 134 of the NVM 140 of FIG. 1) or by checking an error detection code portion of an error correction code (ECC).

The at least the portion of the write verify operation may additionally or alternatively include the controller determining whether a number of error bits (e.g., a BER 434 of FIG. 4) in the read back data satisfies a threshold 436 (e.g., whether the number of error bits exceeds a predetermined amount). The at least the portion of the write verify operation may not include rewriting the shaped data 412 to a different physical page of the MLC portion if the number of error bits in the read back data does not satisfy the threshold 436. For example, when the number of error bits detected in the read back data does not satisfy the threshold 436, the first copy may be deemed valid, subsequent reads of the shaped data 412 may be from the first copy at the first physical page, and any errors in the first copy may be corrected by ECC at the controller.

The at least the portion of the write verify operation may include rewriting a second copy of the shaped data 412 to a different physical page of the MLC portion of the NVM if the number of error bits (e.g., the BER 434) detected in the read back data satisfies the threshold 436. The second copy may correspond to the original shaped data 412 which may be cached or may correspond to corrected shaped data (e.g., the first copy corrected using the ECC). Thus, the least the portion of the write verify trigger operation 432 may be performed when the combination of the logical pages of the shaped data 412 satisfies one or more criteria of the shaping adjustment criteria 424 that are associated with the write verify trigger operation, and may not be performed when the combination of the logical pages of the shaped data 412 does not satisfy one or more criteria of the shaping adjustment criteria 424 that are associated with the write verify trigger operation.

In some examples, when the number of errors (e.g., the BER 434) detected in the read back data (e.g., a read back copy of the shaped data 412) satisfies the threshold 436, at least a portion of the write verify operation may be performed periodically. For example, at least a read operation of the write verify operation may be performed periodically in response to determining that the BER 434 associated with the shaped data 412 (the read back copy of the shaped data 412) satisfies the threshold 436. Thus, at least a portion of the write verify operation (e.g., a read operation of the write verify operation) may be performed only in response to the write verify trigger operation 432 until a write verify operation (triggered by the write verify trigger operation 432) is performed and determines that the number of error bits (e.g., the BER 434) detected in the read back data satisfies the threshold 436, at which point the at least the portion of the write verify operation may be performed intermittently regardless of whether the write verify trigger operation 432 is performed.

Adjust System Threshold

The adjust system threshold operation 416 may include adjusting a threshold associated with a write verify operation performed on one or more of the logical pages 462, 464, and 466 of the shaped data 412. The adjust system threshold operation 416 may be performed when the combination of the logical pages of the shaped data 412 satisfies one or more criteria of the shaping adjustment criteria 424 that are associated with the adjust system threshold operation 416. For example, the adjust system threshold operation 416 may be performed when the combination of the logical pages 462, 464, and 466 of the shaped data 412 satisfies one or more criteria of the shaping adjustment criteria 424 that correspond to an unacceptably high probability of program disturb or when the combination satisfies one or more criteria of the shaping adjustment criteria 424 that correspond to an unacceptably high probability of problematic overlap of neighboring states. For example, the adjust system threshold operation 416 may be performed in response to the shaped data tester 422 determining that the shaped data 412 satisfies the shaping adjustment criteria 425, the shaping adjustment criteria 455, or the shaping adjustment criteria 485, as described above.

As described above, a write verify operation may include selectively rewriting a second copy of data read from a first physical page of an MLC portion of an NVM (e.g., the physical page 137 of the MLC portion 136 of the NVM 140) to a different physical page of the MLC portion of the NVM based on whether a number of errors in a first copy of the data read form the first physical page satisfies the threshold 436 of FIG. 4. The adjust system threshold may include adjusting the threshold 436 when the combination of the logical pages of the shaped data 412 satisfies one or more criteria of the shaping adjustment criteria 424 that are associated with the adjust system threshold operation 416.

Although the operations 403, 405, 413, 414, 416, 418, and/or 432 are described above using one or more examples in which the shaping adjustment criteria 424 corresponds to criteria indicative of a high program disturb and/or a problematic cell state overlap, the operations 403, 405, 413, 414, 416, 418, and/or 432 may be performed in response to one or more criteria that are indicative of other causes or markers of bit errors. Additionally, although the cell states used to describe program disturb or problematic overlap are described above as including the ER state, the G state, and/or the A state, program disturb or problematic overlap may be characterized by threshold voltage distribution patterns having particular probabilities of other cell states (e.g., additional to, or not inclusive of, the ER state, the A state, or the G state). Furthermore, although the cell states of the shaping adjustment criteria 424 are described with reference to particular shaping level combination probabilities, one or more different probability values may be used and the exemplary probabilities described herein for illustration purposes should not be considered as being restrictive. Additionally, although the shaping adjustment criteria 424 are described with reference to threshold voltage distribution patterns for an MLC having 3-bits per cell (e.g., eight cell states), memory having a different number of bits per cell may be used. For example, the MLC may use two bits per cell or more than three bits per cell.

Figure 5:
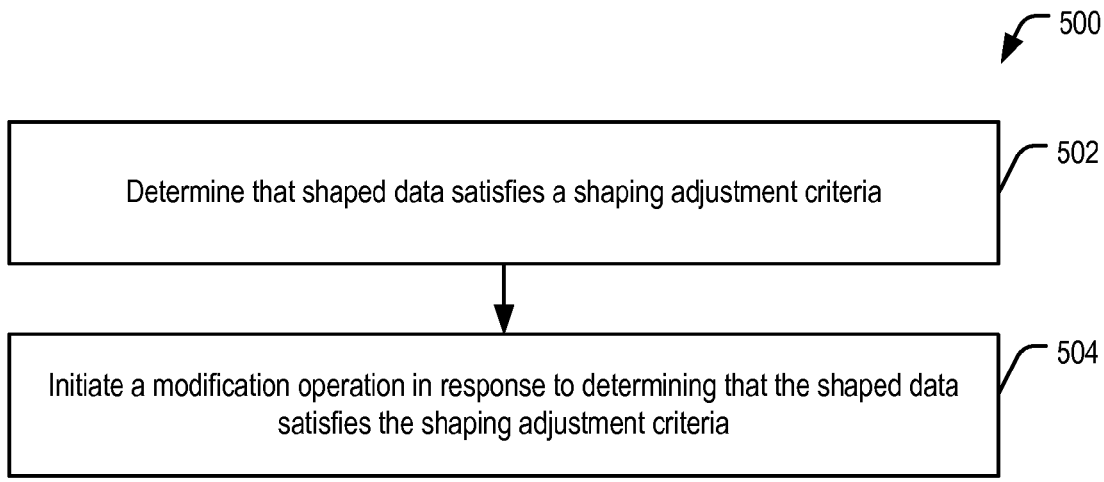
FIG. 5 is a flow chart illustrating a particular embodiment of a method of selectively performing a modification operation.

FIG. 5 illustrates an embodiment of a method 500 of initiating a modification operation in response to determining that shaped data satisfies one or more shaping adjustment criteria. The method 500 may be performed using the system 100 of FIG. 1 and/or the components 400 of FIG. 4.

The method 500 of FIG. 5 includes determining that shaped data satisfies one or more shaping adjustment criteria, at 502. The shaped data may correspond to the shaped data 116 of FIG. 1 or the shaped data 412 of FIG. 4, and the shaping adjustment criteria may correspond to one or more of the shaping adjustment criteria 424 of FIG. 4. Although the shaping adjustment criteria 424 are described above using example shaping adjustment criteria that are indicative of a high program disturb and/or a problematic cell state overlap, the shaping adjustment criteria 424 may include one or more shaping adjustment criteria that are indicative of other causes or markers of bit errors. Additionally, although the cell states of the shaping adjustment criteria 424 are described above as including the ER state, the G state, and/or the A state, one or more shaping adjustment criteria of the shaping adjustment criteria 424 may be defined without using probabilities of one or more of the ER state, the A, or the G state or may be defined using probabilities of one or more other cell states additional to the ER state, the A state, or the G state. Furthermore, although the cell states of the shaping adjustment criteria 424 are described with reference to particular shaping level combination probabilities, one or more different probability values may be used and the exemplary probabilities described herein for illustration purposes should not be considered as being restrictive.

The shaped data may be determined to satisfy the shaping adjustment criteria as described above with reference to FIG. 4. For example, a data storage device may determine a shaping level of logical pages to be folded into a physical page of an MLC portion of a NVM as described above. The data storage device may compare the shaping levels to a set of criteria to determine whether the shaping levels match the criteria. Alternatively, or in addition, the data storage device may determine a characteristic, property, or distribution pattern associated with the combination of the shaped data. For example, the data storage device may determine a threshold voltage distribution pattern including one or more cell state probabilities as described above. The data storage device may determine whether the combination of the shaped data satisfies the shaping adjustment criteria by comparing the characteristic, property, or distribution pattern associated with the combination of the shaped data to the shaping adjustment criteria as described above.

The method 500 of FIG. 5 includes initiating a modification operation in response to determining that the shaped data satisfies the shaping adjustment criteria, at 504. The modification operation may include an interchange operation (e.g., the interchange operation 403 of FIG. 4), a page matching operation (e.g., the page matching 413), an adaptive trim operation (e.g., the adaptive trim operation 414), a logical NOT operation (e.g., the logical NOT operation 418), a write verify trigger operation (e.g., the write verify trigger operation 432), or an operation that adjusts one or more system thresholds (e.g., the adjust system threshold operation 416).

Figure 6:
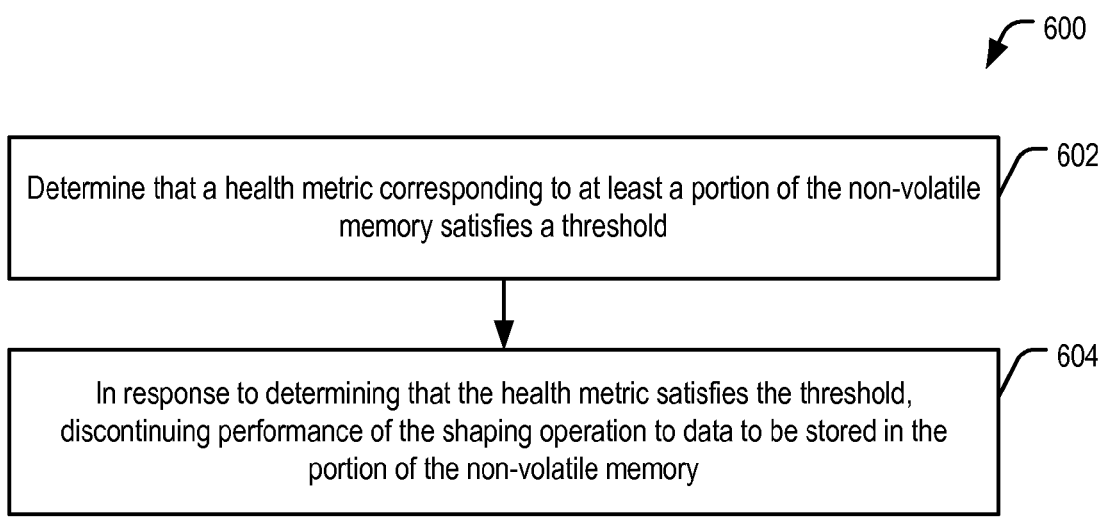
FIG. 6 is a flow chart illustrating a particular embodiment of a method of selectively discontinuing shaping data.

FIG. 6 illustrates an embodiment of a method 600 of discontinuing a shaping operation based on determining that a health metric satisfies a threshold. The method 600 may be performed using a data storage device configured to perform a shaping operation to shape data prior to storing the data to a non-volatile memory of the data storage device. For example, the method 600 may be performed using the data storage device 220 of FIG. 2 including the shaping unit 226 to shape data prior to storing the data to the NVM 240.

The method 600 includes determining that a health metric corresponding to at least a portion of the NVM satisfies a threshold, at 602 of FIG. 6. The at least the portion of the NVM may correspond to one or more blocks of the NVM, one or more planes of the NVM, or one or more dies of the NVM. For example, the at least the portion of the NVM may correspond to one or more blocks of the NVM 240 of FIG. 2, one or more planes of the NVM 240, or one or more dies of the NVM 240 as described above with reference to FIG. 2. As illustrative, non-limiting, examples, the health metric may correspond to a number of program/erase (P/E) cycles, to an amount of the at least the portion of the NVM storing data, to a BER (e.g., an average BER) corresponding to the at least the portion of the NVM, or to an average shaping level of data stored in the at least the portion of the NVM, as described above with reference to FIG. 2. The threshold may be selected to avoid reliability issues associated with shaping data as described above with reference to FIG. 2.

The method 600 of FIG. 6 includes, in response to determining that a health metric corresponding to at least a portion of the NVM satisfies a threshold, discontinuing performance of the shaping operation to data to be stored in the at least the portion of the NVM, at 604. For example, in response to determining the health metric of the at least the portion of the NVM 240 of FIG. 2 satisfies the threshold, the controller 230 may take action that causes the controller (e.g., the shaping unit 226) to discontinue shaping data to be stored at the at least the portion of the NVM 240, as described above. In some examples, data to be stored at the at least the portion of the NVM may be scrambled in lieu of shaping in response to determining that the health metric corresponding to the at least the portion of the NVM satisfies the threshold.

Although various components depicted herein are illustrated as block components and described in general terms, such components may include one or more microprocessors, state machines, or other circuits or circuitry configured to enable the disclosed components to perform the particular functions attributed to such components. For example, the shaped data tester 122 or 123 of FIG. 1, the modification engine 128 of FIG. 1, the counter 153 of FIG. 1, the scrambler 151 of FIG. 1, the comparator 214 of FIG. 2, the scrambler 224 or 252 of FIG. 2, the counter 258 of FIG. 2, the shaped data tester 422 of FIG. 4, or the modification engine 428 of FIG. 4 may represent physical components, such as hardware controllers, state machines, logic circuits, or other structures. Alternatively, one of more aspects of the functionality of the preceding modules may be implemented using a microprocessor or microcontroller programmed to perform the respective functionality.

In a particular embodiment, the NVM 140 of FIG. 1 or 240 of FIG. 2 includes executable instructions that are executed by a processor in the controller 130 of FIG. 1 or 230 of FIG. 2, respectively. Alternatively, or in addition, executable instructions that are executed by a processor in the controller 130 of FIG. 1 or 230 of FIG. 2 may be stored at a separate memory location that is not part of the NVM 140 or 240, such as at a RAM or at a read-only memory (ROM).

The instructions may include instructions that when executed by the processor cause the processor to determine whether shaped data (e.g., the shaped data 116 of FIG. 1, 228 of FIG. 2, or 412 of FIG. 4) satisfies one or more shaping adjustment criteria (e.g., one or more of the shaping adjustment criteria 424 of FIG. 4). For example, the instructions may include instructions that cause the processor to determine shaping levels of shaped data before transferring the shaped data to NVM by counting 1-s in the shaped data and storing the shaping levels in management tables as described above. Alternatively, the instructions may include instructions that cause the processor to determine shaping levels of the shaped data after transferring the shaped data to the NVM by counting 1-s in the shaped data read from the NVM as described above. The instructions may further cause the processor to compare the shaping levels to the shaping adjustment criteria to determine whether the shaping levels satisfy one or more of the shaping adjustment criteria as described above by comparing each logical page's shaping level to a corresponding threshold for that logical page, and in response to each of the shaping levels equaling or exceeding its respective threshold, generating an indicator (e.g., a bit) that the shaping adjustment criteria has been satisfied.

The instructions may include instructions that when executed by the processor cause the processor to initiate a modification operation in response to determining that the shaped data satisfies one or more of the shaping adjustment criteria. For example, initiating the modification operation may include accessing a LUT that associates modification operations with shaping adjustment criteria.

The instructions may include instructions that when executed by the processor cause the processor to determine that one or more health metrics (e.g., the health metric 216, 218, 219, or 221 of FIG. 2) satisfy a threshold. For example, the instructions may cause the processor to determine the health metric by counting a number of P/E cycles 218 as described above and storing the count in memory of a controller (e.g., the controller 230 of FIG. 2). The instructions may cause the processor to read a threshold LUT to access one or more thresholds (e.g., from a threshold LUT) and compare one or more of the health metrics to the accessed thresholds.

The instructions may include instructions that when executed by the processor cause the processor to discontinue performance of the shaping operation to data (e.g. the data 212 of FIG. 2) in response to determining that the health metric satisfies the threshold. For example, the instructions may cause the processor to compare the health metric to the threshold. In response to the health metric exceeding the threshold, the instructions may cause the processor to set an indicator (e.g., a bit value in a control register) that indicates that the shaping unit (e.g., the shaping unit 226 of FIG. 2) is to be bypassed during data processing. The controller may route the data from a host device (e.g, the host device 210) to a NVM (e.g., the NVM 240 of FIG. 2) without providing the data to the shaping unit. Additionally, the instructions may include instructions that cause the processor to scramble the data. For example, the instructions may cause a linear feedback shift register (LFSR) to generate a pseudo-random sequence of bit values that are XOR'ed with the input data to generate scrambled data.

In a particular embodiment, the data storage device 120 of FIG. 1 or 220 of FIG. 2 may be a portable device configured to be selectively coupled to one or more external devices. However, in other embodiments, the data storage device may be attached or embedded within one or more host devices, such as within a housing of a portable communication device. For example, the data storage device may be within a packaged apparatus such as a wireless telephone, a personal digital assistant (PDA), a gaming device or console, a portable navigation device, a computer device, or other device that uses internal non-volatile memory.

Semiconductor memory devices, such as the NVM 140 of FIG. 1 or the NVM 240 of FIG. 2, include volatile memory devices, such as dynamic random access memory ("DRAM") or static random access memory ("SRAM") devices, non-volatile memory devices, such as magnetoresistive random access memory ("MRAM"), resistive random dom access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
in a data storage device including a non-volatile memory, performing:
determining that shaped data satisfies one or more criteria indicative of one or more particular combinations of logical pages; and
initiating a modification operation in response to determining that the shaped data satisfies the one or more criteria.

2. The method of claim 1, wherein the modification operation includes interchanging one or more logical pages of the shaped data prior to storing the shaped data to a physical page of a multi-level cell portion of the non-volatile memory.

3. The method of claim 2, wherein interchanging the one or more logical pages includes interchanging at least two of the one or more logical pages.

4. The method of claim 1, wherein the modification operation includes scrambling the shaped data.

5. The method of claim 1, wherein the modification operation includes selectively performing a logical NOT operation to bit values of one or more logical pages of the shaped data prior to storing the shaped data to a physical page of a multi-level cell portion of the non-volatile memory.

6. The method of claim 1, wherein the modification operation includes an adaptive trim operation.

7. The method of claim 1, wherein the modification operation includes a page matching operation.

8. The method of claim 1, wherein the modification operation includes a triggering operation to trigger performance of at least a portion of a write verify operation.

9. The method of claim 8, wherein a read operation of the write verify operation is performed periodically in response to determining that a bit error rate associated with the shaped data satisfies a threshold.

10. The method of claim 1, wherein the modification operation includes adjusting a threshold associated with a write verify operation.

11. A method comprising:
in a data storage device including a non-volatile memory, the data storage device configured to perform a shaping operation to shape data prior to storing the data to the non-volatile memory, performing:
  determining that a health metric corresponding to at least a portion of the non-volatile memory satisfies a threshold; and
  in response to determining that the health metric satisfies the threshold, discontinuing performance of the shaping operation to data to be stored in the portion of the non-volatile memory.

12. The method of claim 11, wherein the health metric corresponds to a bit error rate of the portion of the non-volatile memory.

13. The method of claim 11, wherein the health metric corresponds to a count of program/erase cycles of the portion of the non-volatile memory.

14. A flash memory device comprising:
  a non-volatile memory;
  a controller coupled to the non-volatile memory, the controller including a shaping unit configured to shape data; and
  a shaped data tester configured to determine whether shaped data satisfies one or more criteria indicative of one or more particular combinations of logical pages.

15. The flash memory device of claim 14, further comprising a modification engine configured to perform a modification operation associated with the shaped data in response to determining that the shaped data satisfies the one or more criteria.

16. The flash memory device of claim 15, wherein the modification operation includes interchanging one or more logical pages of the shaped data prior to storing the shaped data to a physical page of a multi-level cell portion of the non-volatile memory.

17. The flash memory device of claim 16, wherein interchanging the one or more logical pages includes interchanging at least two of the one or more logical pages.

18. The flash memory device of claim 15, wherein the modification operation includes scrambling the shaped data.

19. The flash memory device of claim 15, wherein the modification operation includes selectively performing a logical NOT operation to bit values of one or more logical pages of the shaped data prior to storing the shaped data to a physical page of a multi-level cell portion of the non-volatile memory.

20. The flash memory device of claim 15, wherein the modification operation includes an adaptive trim operation.

21. The flash memory device of claim 15, wherein the modification operation includes a page matching operation.

22. The flash memory device of claim 15, wherein the modification operation includes a triggering operation to trigger performance of at least a portion of a write verify operation.

23. The flash memory device of claim 22, wherein a read operation of the write verify operation is performed periodically in response to determining that a bit error rate (BER) associated with the shaped data satisfies a threshold.

24. The flash memory device of claim 15, wherein the modification operation includes adjusting a threshold associated with a write verify operation.

25. The flash memory device of claim 15, wherein the controller includes the shaped data tester and the non-volatile memory includes the modification engine.

26. The flash memory device of claim 15, wherein the controller includes the shaped data tester and the modification engine.

27. The flash memory device of claim 15, wherein the non-volatile memory includes the shaped data tester and the modification engine or the non-volatile memory includes the shaped data tester and the controller includes the modification engine.

28. A flash memory device comprising:
  a non-volatile memory; and
  a controller coupled to the non-volatile memory, the controller including a shaping unit configured to shape data, the controller further including a comparator configured to compare a health metric for at least a portion of the non-volatile memory to a threshold, wherein the controller is configured to bypass the shaping unit in response to the comparator indicating that the health metric for the at least the portion of the non-volatile memory satisfies the threshold.

29. The flash memory device of claim 28, wherein the health metric for the at least the portion of the non-volatile memory corresponds to a bit error rate.

30. The flash memory device of claim 28, wherein the health metric for the portion of the non-volatile memory corresponds to a count of program/erase cycles of the at least the portion of the non-volatile memory.

* * * * *